United States Patent
Lim et al.

(10) Patent No.: US 11,390,806 B2
(45) Date of Patent: *Jul. 19, 2022

(54) COMPOSITION FOR ETCHING AND METHOD FOR MANUFACTURING SEMICONDUCTOR DEVICE USING SAME

(71) Applicant: SOULBRAIN CO., LTD., Gyeonggi-do (KR)

(72) Inventors: Jung Hun Lim, Daejeon (KR); Jin Uk Lee, Daejeon (KR); Jae Wan Park, Daegu (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/093,652

(22) Filed: Nov. 10, 2020

(65) Prior Publication Data
US 2021/0054282 A1  Feb. 25, 2021

Related U.S. Application Data
(63) Continuation of application No. 15/781,471, filed as application No. PCT/KR2016/012215 on Oct. 28, 2016, now Pat. No. 11,149,200.

(30) Foreign Application Priority Data

| Dec. 4, 2015 | (KR) | 10-2015-0172472 |
| Dec. 15, 2015 | (KR) | 10-2015-0178772 |
| Dec. 15, 2015 | (KR) | 10-2015-0178774 |
| Dec. 15, 2015 | (KR) | 10-2015-0178775 |
| Dec. 15, 2015 | (KR) | 10-2015-0178776 |
| Dec. 15, 2015 | (KR) | 10-2015-0178777 |
| Dec. 15, 2015 | (KR) | 10-2015-0178778 |

(51) Int. Cl.
*C09K 13/06* (2006.01)
*H01L 21/306* (2006.01)
*H01L 21/311* (2006.01)
*C09K 13/04* (2006.01)

(52) U.S. Cl.
CPC ........ *C09K 13/06* (2013.01); *H01L 21/30604* (2013.01); *H01L 21/31111* (2013.01); *C09K 13/04* (2013.01)

(58) Field of Classification Search
CPC ........ C09K 13/04; C09K 13/06; C09K 13/08; C09K 13/00; H01L 21/30604; H01L 21/31111; H01L 21/31138; H01L 21/31116; C23F 1/10
USPC .... 252/79.1, 79.2, 79.3, 79.4; 216/103, 106, 216/107
See application file for complete search history.

(56) References Cited

U.S. PATENT DOCUMENTS

| 2004/0134873 A1* | 7/2004 | Yao ..................... H01L 21/3212 216/2 |
| 2016/0017224 A1* | 1/2016 | Lee ................... H01L 21/02458 438/706 |

* cited by examiner

*Primary Examiner* — Lan Vinh
(74) *Attorney, Agent, or Firm* — Jongkook Park

(57) ABSTRACT

A composition for etching and a method of manufacturing a semiconductor device, the method including an etching process of using the composition for etching, are provided. The composition for etching includes a first inorganic acid; any one first additive selected from the group consisting of phosphorous acid, an organic phosphite, a hypophosphite, and mixtures thereof; and a solvent. The composition for etching is a high-selectivity composition for etching that can selectively remove a nitride film while minimizing the etch rate for an oxide film and does not have a problem such as particle generation, which adversely affects device characteristics.

3 Claims, 10 Drawing Sheets

COMPOSITION FOR ETCHING AND METHOD FOR MANUFACTURING SEMICONDUCTOR DEVICE USING SAME

CROSS REFERENCE TO RELATED APPLICATIONS

This application is continuation application of U.S. patent application Ser. No. 15/71,471, which is a National Stage Patent Application of PCT International Patent Application No. PCT/KR2016/012215 (filed on Oct. 28, 2016) under 35 U.S.C. § 371, which claims priority to Korean Patent Application Nos. 10-2015-0172472 (filed on Dec. 4, 2015), 10-2015-0178772 (filed on Dec. 15, 2015), 10-2015-0178774 (filed on Dec. 15, 2015), 10-2015-0178775 (filed on Dec. 15, 2015), 10-2015-0178776 (filed on Dec. 15, 2015), 10-2015-0178777 (filed on Dec. 15, 2015), and 10-2015-0178778 (filed on Dec. 15, 2015), the teachings of which are incorporated herein in their entireties by reference.

TECHNICAL FIELD

The present invention relates to a composition for etching, and more particularly, to a high-selectivity composition for etching capable of selectively removing a nitride film while minimizing the etching rate for an oxide film, and to a method of manufacturing a semiconductor element, the method including an etching process of using this composition for etching.

BACKGROUND ART

In semiconductor manufacturing processes, oxide films such as a silicon oxide film ($SiO_2$) and nitride films such as a silicon nitride film ($SiN_x$) are representative insulating films, and these films are used each independently, or one or more layers are used in an alternately laminated form. Furthermore, these oxide films and nitride films are also used as hard masks for forming electroconductive patterns such as metal wiring.

In a wet etching process for removing a nitride film, a mixture of phosphoric acid and deionized water is generally used. The deionized water is added in order to prevent a decrease in the etch rate and a variation in the etch selectivity for oxide films; however, there is a problem that even a small change in the amount of deionized water supplied may cause defects in a process for removing a nitride film by etching. Furthermore, phosphoric acid is a strong acid showing corrosiveness, and handling of this acid is difficult.

In order to solve these problems, technologies for removing a nitride film by using a composition for etching including phosphoric acid ($H_3PO_4$) and hydrofluoric acid (HF) or nitric acid ($HNO_3$) have been conventionally known; however, these technologies rather resulted in lowering of the etch selectivity between a nitride film and an oxide film. Furthermore, technologies of using a composition for etching including phosphoric acid and a silicic acid salt or silicic acid are also known; however, there is a problem that silicic acid or a silicic acid salt causes generation of particles that may adversely affect a substrate and is therefore rather unsuitable for semiconductor manufacturing processes.

FIG. 1 and FIG. 2 are process cross-sectional views illustrating a device separation process for a flash memory device.

First, as illustrated in FIG. 1, tunnel oxide film (11), polysilicon film (12), buffer oxide film (13), and pad nitride film (14) are sequentially formed on substrate (10), and then polysilicon film (12), buffer oxide film (13), and pad nitride film (14) are selectively etched to form trenches. Subsequently, spin-on-dielectric (SOD) oxide film (15) is formed until the trenches are gap-filled, and then SOD oxide film (15) is subjected to a chemical mechanical polishing (CMP) process by using pad nitride film (14) as a polishing stopper film.

Next, as illustrated in FIG. 2, pad nitride film (14) is removed by wet etching using a phosphoric acid solution, and then buffer oxide film (13) is removed by a washing process. Thereby, device separation film (15A) is formed in the field region. However, in the case of using phosphoric acid in such a wet etching process for removing a nitride film, due to a decrease in the etch selectivity between a nitride film and an oxide film, a nitride film as well as an SOD oxide film are etched, and thus, it becomes difficult to regulate the effective field oxide height (EFH). Accordingly, a sufficient wet etching time for removing a nitride film cannot be secured, or additional processes are needed, and thus phosphoric acid causes changes and adversely affects the device characteristics.

Therefore, under the current circumstances, there is a demand for a high-selectivity composition for etching that can selectively etch a nitride film with respect to an oxide film in a semiconductor production process but does not have a problem such as particle generation.

DISCLOSURE

Technical Problem

An object of the present invention is to provide a high-selectivity composition for etching that can selectively remove a nitride film while minimizing the etch rate of an oxide film and does not have problems such as particle generation adversely affecting the device characteristics, and a method of manufacturing a semiconductor device using this composition for etching.

Technical Solution

A composition for etching according to an aspect of the present invention includes a first inorganic acid; any one first additive selected from the group consisting of phosphorous acid, an organic phosphite, a hypophosphite, and mixtures thereof; and a solvent.

The first inorganic acid may be any one selected from the group consisting of sulfuric acid, nitric acid, phosphoric acid, silicic acid, fluoric acid, boric acid, hydrochloric acid, perchloric acid, and mixtures of these.

The organic phosphite may be any one alkyl phosphite selected from the group consisting of dimethyl phosphite, diethyl phosphite, dipropyl phosphite, diisopropyl phosphite, dibutyl phosphite, trimethyl phosphite, triethyl phosphite, tripropyl phosphite, triisopropyl phosphite, tributyl phosphite, diphenyl phosphite, dibenzyl phosphite, and mixtures of these.

The hypophosphite may be any one selected from the group consisting of ammonium hypophosphite, sodium hypophosphite, potassium hypophosphite, and mixtures of these.

The composition for etching may include 0.01% to 15% by weight of the first additive, 70% to 99% by weight of the first inorganic acid, and the solvent occupying the balance.

The composition for etching may further include a second additive that includes a silane inorganic acid salt produced by reacting a second inorganic acid and a silane compound.

The silane inorganic acid salt may be a silane inorganic acid salt produced by reacting any one second inorganic acid selected from the group consisting of sulfuric acid, fuming sulfuric acid, nitric acid, phosphoric acid, anhydrous phosphoric acid, and mixtures thereof, with a silane compound represented by the following Chemical Formula 10.

[Chemical Formula 10]

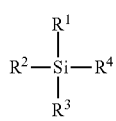

In Chemical Formula 10, $R^1$ to $R^4$ each independently represent any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms; and at least any one of $R^1$ to $R^4$ represents a halogen atom or an alkoxy group having 1 to 10 carbon atoms.

The silane inorganic acid salt may be a silane inorganic acid salt produced by reacting a second inorganic acid including polyphosphoric acid with a silane compound represented by the following Chemical Formula 10.

[Chemical Formula 10]

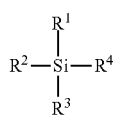

In Chemical Formula 10, $R^1$ to $R^4$ each independently represent any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms; and at least one of $R^1$ to $R^4$ is a halogen atom or an alkoxy group having 1 to 10 carbon atoms.

The silane inorganic acid salt may include a compound represented by the following Chemical Formula 100.

[Chemical Formula 100]

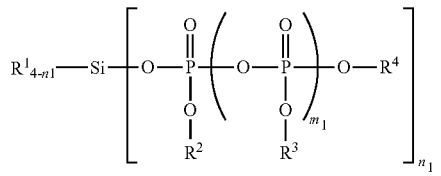

In Chemical Formula 100, $R^1$ represents any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms; $n_1$ represents an integer from 1 to 4; $m_1$ represents an integer from 1 to 10; and $R^2$ to $R^4$ each represent a hydrogen atom.

The silane inorganic acid salt represented by Chemical Formula 100 is such that any one of the hydrogen atoms represented by $R^2$ to $R^4$ may be substituted with a substituent represented by the following Chemical Formula 120.

[Chemical Formula 120]

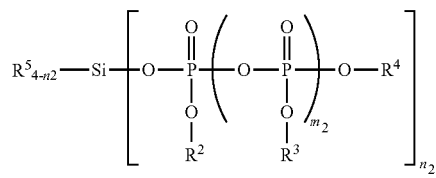

In Chemical Formula 120, any one of $R^5$'s represents a linking group linked to a structure represented by Chemical Formula 100, while the others each independently represent any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms; $R^2$ to $R^4$ each independently represent a hydrogen atom or a second substituent represented by Chemical Formula 120; $n_2$ represents an integer from 0 to 3; and $m_2$ represents an integer from 1 to 10.

The silane inorganic acid salt may be a siloxane inorganic acid salt produced by reacting any one second inorganic acid selected from the group consisting of phosphoric acid, anhydrous phosphoric acid, pyrophosphoric acid, polyphosphoric acid, and a mixture thereof, with a siloxane compound represented by the following Chemical Formula 20.

[Chemical Formula 20]

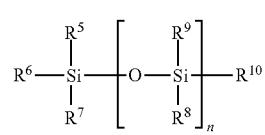

In Chemical Formula 20, $R^5$ to $R^{10}$ each independently represent any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms; at least any one of $R^5$ to $R^{10}$ represents a halogen atom or an alkoxy group having 1 to 10 carbon atoms; and n represents an integer from 1 to 10.

The siloxane inorganic acid salt may include a compound represented by the following Chemical Formula 200.

[Chemical Formula 200]

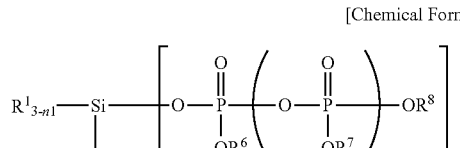
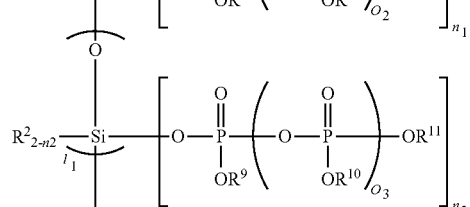
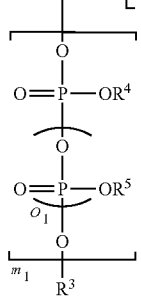

In Chemical Formula 200, $R^1$ to $R^2$ each independently represent any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms; $n_1$ represents an integer from 0 to 3; $n_2$ represents an integer from 0 to 2; $m_1$ represents an integer of 0 or 1; the relation: $n_1+n_2+m_1 \geq 1$ is satisfied; $l_1$ represents an integer from 1 to 10; $o_1$ to $o_3$ each independently represent an integer from 0 to 10; and $R^3$ to $R^{11}$ each independently represent a hydrogen atom.

The siloxane inorganic acid salt represented by Chemical Formula 200 is such that any one hydrogen atom selected from the group consisting of $R^3$ to $R^{11}$ may be substituted by a substituent represented by the following Chemical Formula 220.

[Chemical Formula 220]

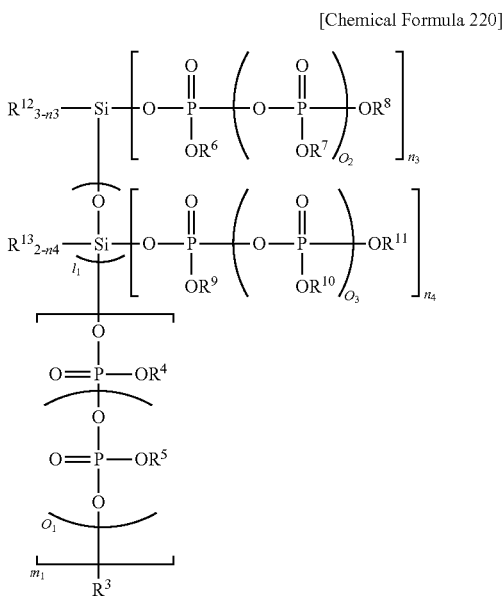

In Chemical Formula 220, any one of $R^{12}$'s and $R^{13}$'s represents a linking group linked to a structure represented by Chemical Formula 200, while the others each independently represent any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms; $R^3$ to $R^{11}$ each independently represent a hydrogen atom or a second substituent represented by Chemical Formula 220; $n_3$ represents an integer from 0 to 3; $n_4$ represents an integer from 0 to 2; $m_1$ represents an integer of 0 to 1; $l_1$ represents an integer from 1 to 10; and $o_1$ to $o_3$ each independently represent an integer from 0 to 10.

The silane inorganic acid salt may be a siloxane inorganic acid salt produced by reacting any one second inorganic acid selected from the group consisting of sulfuric acid, fuming sulfuric acid, and a mixture thereof, with a siloxane compound represented by the following Chemical Formula 20.

[Chemical Formula 20]

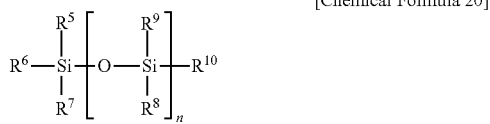

In Chemical Formula 20, $R^5$ to $R^{10}$ each independently represent any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms; at least any one of $R^5$ to $R^{10}$ represents a halogen atom or an alkoxy group having 1 to 10 carbon atoms; and n represents an integer from 1 to 10.

The siloxane inorganic acid salt may include a compound represented by the following Chemical Formula 230.

[Chemical Formula 230]

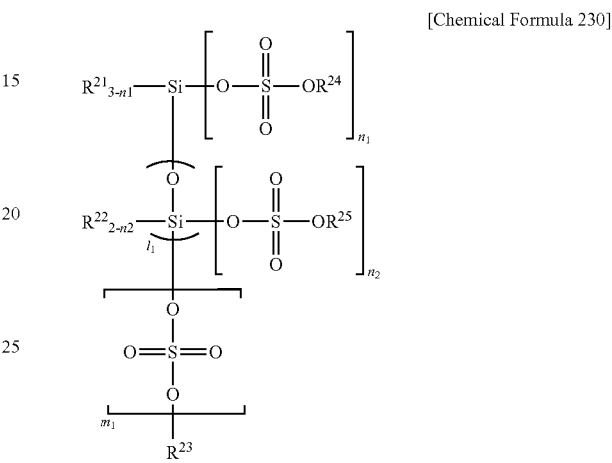

In Chemical Formula 230, $R^{21}$ and $R^{22}$ each independently represent any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms; $n_1$ represents an integer from 0 to 3; $n_2$ represents an integer from 0 to 2; $m_1$ represents an integer of 0 or 1; the relation: $n_1+n_2+m_1$ is satisfied; $l_1$ represents an integer from 1 to 10; and $R^{23}$ to $R^{25}$ each represent a hydrogen atom.

The siloxane inorganic acid salt represented by Chemical Formula 230 is such that any one hydrogen atom selected from the group consisting of $R^{23}$ to $R^{25}$ may be substituted by a substituent represented by the following Chemical Formula 250.

[Chemical Formula 250]

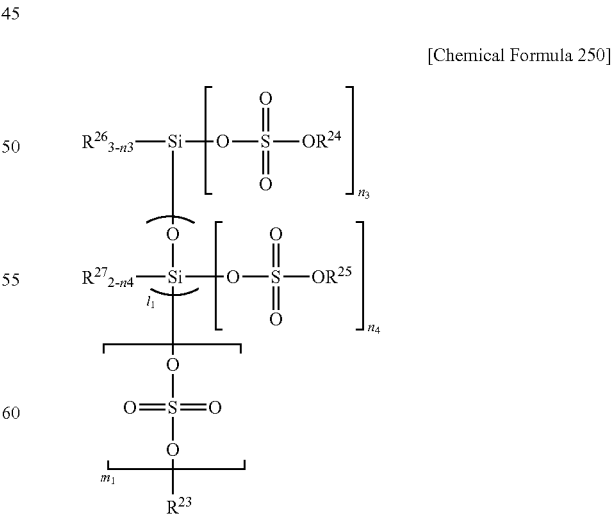

In Chemical Formula 250, any one of $R^{26}$'s and $R^{27}$'s represents a linking group linked to a structure represented by Chemical Formula 230, while the others each independently represent any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms; $R^{23}$ to $R^{25}$ each independently represent a hydrogen atom or a second substituent represented by Chemical Formula 250; $n_3$ represents an integer from 0 to 3; $n_4$ represents an integer from 0 to 2; $m_1$ represents an integer of 0 or 1; and $l_1$ represents an integer from 1 to 10.

The silane inorganic acid salt may be a siloxane inorganic acid salt produced by reacting a second inorganic acid including nitric acid, with a siloxane compound represented by the following Chemical Formula 20.

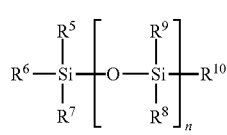

[Chemical Formula 20]

In Chemical Formula 20, $R^5$ to $R^{10}$ each independently represent any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms; at least any one of $R^5$ to $R^{10}$ represents a halogen atom or an alkoxy group having 1 to 10 carbon atoms; and n represents an integer from 1 to 10.

The siloxane inorganic acid salt may include a compound represented by the following Chemical Formula 260.

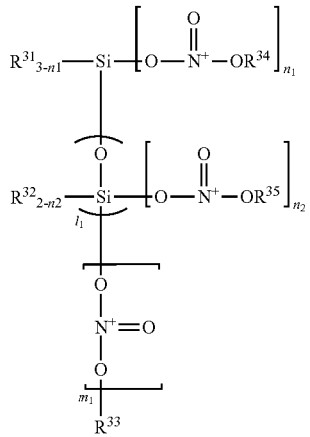

[Chemical Formula 260]

In Chemical Formula 260, $R^{31}$ and $R^{32}$ each independently represent any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms; $n_1$ represents an integer from 0 to 3; $n_2$ represents an integer from 0 to 2; $m_1$ represents an integer of 0 or 1; the relation: $n_1+n_2+m_1 \geq 1$ is satisfied; $l_1$ represents an integer from 1 to 10; and $R^{33}$ to $R^{35}$ each independently represent a hydrogen atom.

The siloxane inorganic acid salt represented by Chemical Formula 260 is such that any one hydrogen atom selected from the group consisting of $R^{33}$ to $R^{35}$ may be substituted by a substituent represented by the following Chemical Formula 280.

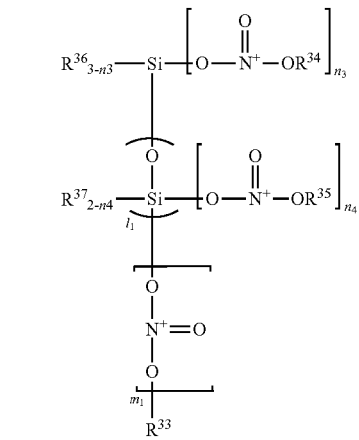

[Chemical Formula 280]

In Chemical Formula 280, any one of $R^{36}$'s and $R^{37}$'s represents a linking group linked to a structure represented by Chemical Formula 260, while the others each independently represent any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms; $R^{33}$ to $R^{35}$ each independently represent a hydrogen atom or a second substituent represented by Chemical Formula 280; $n_3$ represents an integer from 0 to 3; $n_4$ represents an integer from 0 to 2; $m_1$ represents an integer of 0 or 1; and $l_1$ represents an integer from 1 to 10.

The composition for etching may further include a second additive including an alkoxysilane compound represented by the following Chemical Formula 300.

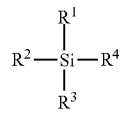

[Chemical Formula 300]

In Chemical Formula 300, $R^1$ to $R^4$ each independently represent any one selected from the group consisting of a hydrogen atom, a halogen atom, a hydroxyl group, an alkyl group having 1 to 10 carbon atoms, an alkoxy group having 1 to 10 carbon atoms, an aminoalkyl group having 1 to 10 carbon atoms, an aminoalkoxy group having 1 to 10 carbon atoms, and an aryl group having 6 to 30 carbon atoms; and at least any one of $R^1$ to $R^4$ represents an alkoxy group having 1 to 10 carbon atoms, an aminoalkyl group having 1 to 10 carbon atoms, or an aminoalkoxy group having 1 to 10 carbon atoms.

The composition for etching may further include a second additive including a siloxane compound represented by the following Chemical Formula 350.

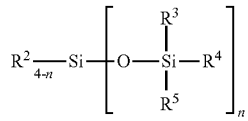

[Chemical Formula 350]

In Chemical Formula 350, $R^2$ to $R^5$ each independently represent any one selected from the group consisting of a hydrogen atom, a halogen atom, a hydroxyl group, an alky group having 1 to 10 carbon atoms, an alkoxy group having 1 to 10 carbon atoms, an aminoalkyl group having 1 to 10 carbon atoms, an aminoalkoxy group having 1 to 10 carbon atoms, and an aryl group having 6 to 30 carbon atoms; at least any one of $R^2$ to $R^5$ represents an alkoxy group having 1 to 10 carbon atoms, an aminoalkyl group having 1 to 10 carbon atoms, or an aminoalkoxy group having 1 to 10 carbon atoms; and n represents an integer from 1 to 4.

The composition for etching may further include a second additive including an oxime compound represented by the following Chemical Formula 400.

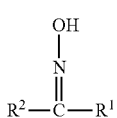

[Chemical Formula 400]

In Chemical Formula 400, $R^1$ and $R^2$ each independently represent any one selected from the group consisting of a hydrogen atom, a halogen atom, an alkyl group having 1 to 20 carbon atoms, an alkoxy group having 1 to 20 carbon atoms, an alkenyl group having 2 to 20 carbon atoms, a cycloalkyl group having 3 to 20 carbon atoms, an aminoalkyl group having 1 to 20 carbon atoms, an aryl group having 6 to 20 carbon atoms, an alkylcarbonyl group having 1 to 20 carbon atoms, an alkylcarbonyloxy group having 1 to 20 carbon atoms, and a cyanoalkyl group having 1 to 10 carbon atoms.

The oxime compound may be any one selected from the group consisting of acetone oxime, 2-butanone oxime, acetaldehyde oxime, cyclohexanone oxime, acetophenone oxime, cyclodecanone oxime, and mixtures thereof.

The composition for etching may further include a second additive including an oxime silane compound represented by the following Chemical Formula 500.

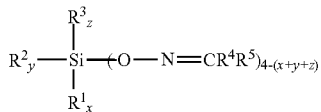

[Chemical Formula 500]

In Chemical Formula 500, $R^1$ to $R^3$ each independently represent any one selected from the group consisting of a hydrogen atom, a halogen atom, an alkyl group having 1 to 20 carbon atoms, an alkenyl group having 2 to 20 carbon atoms, a cycloalkyl group having 3 to 20 carbon atoms, an aryl group having 6 to 20 carbon atoms, an arylalkyl group having 7 to 20 carbon atoms, and an alkylcarbonyl group having 1 to 20 carbon atoms; $R^4$ and $R^5$ each independently represent an alkyl group having 1 to 20 carbon atoms, a cycloalkyl group having 3 to 20 carbon atoms, an aryl group having 6 to 20 carbon atoms, an arylalkyl group having 7 to 20 carbon atoms, and an alkylcarbonyl group having 1 to 20 carbon atoms; or $R^4$ and $R^5$ each represent an alkylene group having 3 to 12 carbon atoms or are linked to each other to form an alicyclic ring; x, y, and z each independently represent an integer from 0 to 3; and x+y+z represents an integer from 0 to 3.

The oxime silane compound may be any one selected from the group consisting of di(ethyl ketoxime)silane, mono(ethyl ketoxime)silane, tris(ethyl ketoxime)silane, tetra(ethyl ketoxime)silane, methyl tris(methyl ethyl ketoxime)silane, methyl tris(methyl ethyl ketoxime)silane, methyl tris(acetoxime)silane, methyl tris(methyl isobutyl ketoxime)silane, dimethyl di(methyl ethyl ketoxime)silane, trimethyl (methl ethyl ketoxime)silane, tetra(methyl ethyl ketoxime)silane, tetra(methyl isobutyl ketoxime)silane, vinyl tris(m-ethyl ethyl ketoxime)silane, methyl vinyl di(methyl ethyl ketoxime)silane, vinyl tris(methyl isobutyl ketoxime)silane, and phenyl tris(methyl ethyl ketoxime)silane.

The composition for etching may include the second additive in an amount of 0.01% to 20% by weight with respect to the total amount of the composition for etching.

The composition for etching may further include an ammonium-based compound in an amount of 0.01% to 20% by weight with respect to the total amount of the composition for etching.

The ammonium-based compound may be any one selected from the group consisting of an aqueous ammonia solution, ammonium chloride, ammonium acetate, ammonium phosphate, ammonium peroxydisulfate, ammonium sulfate, ammonium borate, and mixtures thereof.

The composition for etching may further include a fluorine-based compound in an amount of 0.01% to 1% by weight with respect to the total amount of the composition for etching.

The fluorine-based compound may be any one selected from the group consisting of hydrogen fluoride, ammonium fluoride, ammonium hydrogen fluoride, and mixtures thereof.

A method of manufacturing a semiconductor device according to another embodiment of the present invention includes an etching process carried out using the composition for etching.

The etching process is intended for selective etching of a nitride film with respect to an oxide film, and the nitride film etching process may be carried out at a temperature of 50° C. to 300° C.

Advantageous Effects

Since the composition for etching according to the invention has a feature that the etch selectivity for a nitride film with respect to an oxide film is high, the EFH can be easily regulated by regulating the etch rate for an oxide film.

Furthermore, when the composition for etching of the invention is used, damage to the film quality of an oxide film or deterioration of electrical characteristics caused by etching of an oxide film at the time of removing a nitride film can be prevented, particle generation can be prevented, and the device characteristics can be improved.

Therefore, the present invention is widely applicable to various processes such as a semiconductor production process where selective removal of a nitride film with respect to an oxide film is required; a device separation process for, for example, a flash memory device; a process for forming a pipe channel in a 3D flash memory device; and a process for forming a diode in a phase change memory, and the present invention can improve the process efficiency.

BEST MODE

Figure 1:
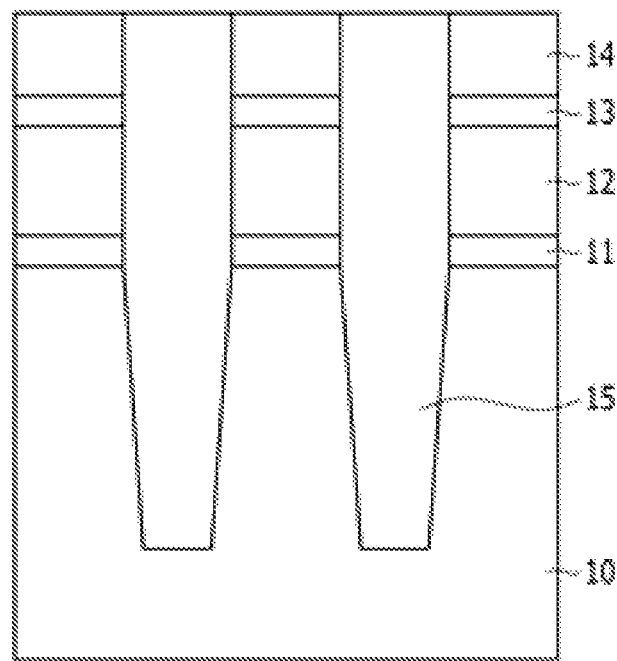
FIG. 1 and FIG. 2 are process cross-sectional views illustrating a device separation process for a flash memory device according to conventional technologies.
Figure 2:
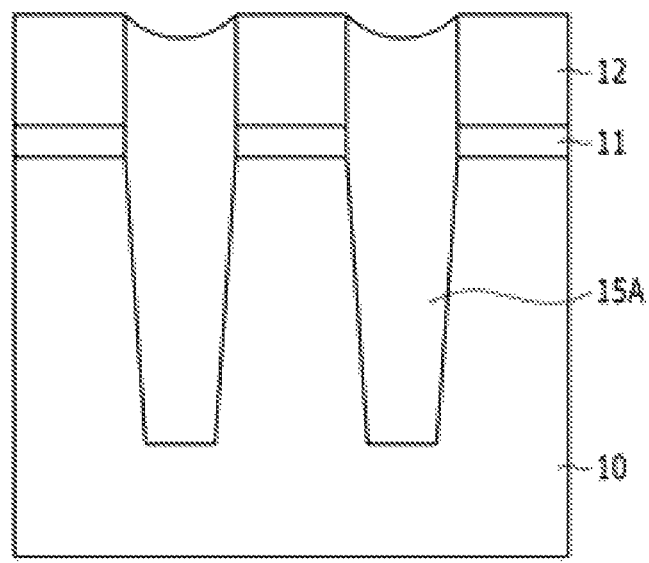

The present invention may be subjected to various modifications and may include various embodiments, and thus particular embodiments will be described in detail in the detailed description of the invention. However, it is not intended to limit the invention by any particular embodiments, and it should be construed that the present invention includes all modifications, equivalents, and replacements that are included in the idea and technical scope of the invention.

The terms used in the invention are used only for the purpose of explaining particular embodiments and are not intended to limit the invention by any means. The expression of singularity includes the expression of plurality, unless stated otherwise in the context. It should be understood that the terms "include" or "have" as used in the invention are intended to indicate the existence of the features, values, stages, actions, constituent elements, component parts, or combinations thereof described in the specification, and the existence or a possibility of addition of one or more other features, values, stages, actions, constituent elements, component parts, and combinations thereof is not to be excluded in advance.

According to the present specification, an alkyl group having 1 to 10 carbon atoms represents a linear or branched non-cyclic saturated hydrocarbon having 1 to 10 carbon atoms, and an alkoxy group having 1 to 10 carbon atoms represents a linear or branched non-cyclic hydrocarbon having one or more ether groups and 1 to 10 carbon atoms.

The composition for etching according to an embodiment of the invention includes a first inorganic acid; any one first additive selected from the group consisting of phosphorous acid, an organic phosphite, a hypophosphite, and mixtures thereof; and a solvent.

The any one first additive selected from the group consisting of phosphorous acid, an organic phosphite, a hypophosphite, and mixtures thereof is preferable from the viewpoint of having excellent solubility in the first inorganic acid and from the viewpoint that stability of the first inorganic acid at high temperature can be secured. Furthermore, the process use time of the composition for etching can be prolonged by using the first additive.

The organic phosphite may be specifically an alkyl phosphite, and the alkyl phosphite may be any one selected from the group consisting of dimethyl phosphite, diethyl phosphite, dipropyl phosphite, diisopropyl phosphite, dibutyl phosphite, trimethyl phosphite, triethyl phosphite, tripropyl phosphite, triisopropyl phosphite, tributyl phosphite, dibenzyl phosphite, and mixtures thereof. Among these, it is preferable to use dimethyl phosphite, from the viewpoint that high solubility in the first inorganic acid and process stability can be secured.

The hypophosphite may be any one selected from the group consisting of ammonium hypophosphite, sodium hypophosphite, potassium hypophosphite, and mixtures thereof, and the hypophosphite is preferably ammonium hypophosphite. The ammonium hypophosphite is a nonmetal additive and is helpful in securing the stability of the semiconductor production process.

The content of the first additive may be 0.01% to 15% by weight, preferably 0.5% to 15% by weight, more preferably 1% to 15% by weight, and even more preferably 3% to 7% by weight, with respect to the total weight of the composition for etching. When the content of the first additive is less than 0.01% by weight, high etch selectivity with respect to a nitride film cannot be obtained, and when the content is more than 15% by weight, it is difficult to expect a further increase in effect associated with an increase in the content, and thermal decomposition of the additive may rather reduce the effect.

Meanwhile, the composition for etching may further include a second additive such as described below, in addition to the first additive.

The second additive may include a silane inorganic acid salt produced by reacting a second inorganic acid with a silane compound. The silane inorganic acid salt can facilitate regulation of an effective field oxide height (EFH) by regulating the etching rate for an oxide film.

According to an embodiment, the silane inorganic acid salt can be produced by reacting the second inorganic acid with the silane compound. Since the silane inorganic acid salt is produced by reacting the second inorganic acid with the silane compound, the silane inorganic acid salt may be not a compound having a single chemical structure, but a mixture of silane inorganic acid salts having various chemical structures. That is, the second additive may include a mixture of at least two or more silane inorganic acid salts having different chemical structures. However, the invention is not intended to be limited to this, and the second additive may include only one kind of silane inorganic acid salt.

The second inorganic acid may be any one selected from the group consisting of sulfuric acid, fuming sulfuric acid, nitric acid, phosphoric acid, anhydrous phosphoric acid, pyrophosphoric acid, polyphosphoric acid, and mixtures thereof, and the second inorganic acid is preferably sulfuric acid, nitric acid, or phosphoric acid.

The silane compound may be any one selected from the group consisting of a compound represented by the following Chemical Formula 10, a compound represented by the following Chemical Formula 20, and a mixture thereof.

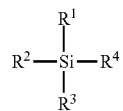

[Chemical Formula 10]

In Chemical Formula 10, $R^1$ to $R^4$ each independently represent any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms; and at least any one of $R^1$ to $R^4$ is a halogen atom or an alkoxy group having 1 to 10 carbon atoms.

The halogen atom may be a fluoro group, a chloro group, a bromo group, or an iodo group, and preferably a fluoro group or a chloro group.

Specifically, the compound represented by Chemical Formula 10 may be a halosilane or alkoxysilane compound.

The halosilane compound may be any one selected from the group consisting of trimethylchlorosilane, triethylchlorosilane, tripropylchlorosilane, trimethylfluorosilane, triethylfluorosilane, tripropylfluorosilane, dimethyldichlorosilane, diethyldichlorosilane, dipropyldichlorosilane, dimethyldifluorosilane, diethyldifluorosilane, dipropyldifluorosilane, ethyltrichlorosilane, propyltrichlorosilane, methyltrifluorosilane, ethyltrifluorosilane, propyltrifluorosilane, and mixtures thereof.

The alkoxysilane compound may be any one selected from the group consisting of tetramethoxysilane (TMOS), tetrapropoxysilane, methyltrimethoxysilane (MTMOS), methyltriethoxysilane (MTEOS), methyltripropoxysilane, ethyltrimethoxysilane, ethyltriethoxysilane, ethyltripropoxysilane, propyltrimethoxysilane (PrTMOS), propyltriethoxysilane (PrTEOS), propyltripropoxysilane, dimethyldimethoxysilane, dimethyldiethoxysilane, dimethyldipropoxysilane, diethyldimethoxysilane, diethyldiethoxysilane, diethyldipropoxysilane, dipropyldimethoxysilane, dipropyldiethoxysilane, dipropyldipropoxysilane, trimethylmethoxysilane, trimethylethoxysilane, trimethylpropoxysilane, triethylmethoxysilane, triethylethoxysilane, triethylpropoxysilane, tripropylmethoxysilane, tripropylethoxysilane, tripropylpropoxysilane, 3-chloropropyltrimethoxysilane, 3-aminopropyltrimethoxysilane, 3-aminopropyltriethoxysilane, [3-(2-aminoethyl)aminopropyl]trimethoxysilane, 3-mercaptopropyltrimethoxysilane, 3-methacryloxypropyltrimethoxysilane, 3-acryloxypropyltrimethoxysilane, and mixtures thereof.

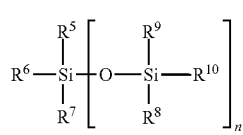

[Chemical Formula 20]

In Chemical Formula 20, $R^5$ to $R^{10}$ each independently represent any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms; at least any one of $R^5$ to $R^{10}$ represents a halogen atom or an alkoxy group having 1 to 10 carbon atoms; and n represents an integer from 1 to 10.

The halogen atom may be a fluoro group, a chloro group, a bromo group, or an iodo group, and the halogen atom is preferably a fluoro group or a chloro group.

Specifically, examples of the compound represented by Chemical Formula 20 include chlorodimethylsiloxy-chlorodimethylsilane, chlorodiethylsiloxy-chlorodimethylsilane, dichloromethylsiloxy-chlorodimethylsilane, dichloroethylsiloxy-chlorodimethylsilane, trichlorosiloxy-chlorodimethylsilane, fluorodimethylsiloxy-chlorodimethylsilane, difluoromethylsiloxy-chlorodimethylsilane, trifluorosiloxy-chlorodimethylsilane, methoxydimethylsiloxy-chlorodimethylsilane, dimethoxymethylsiloxy-chlorodimethylsilane, trimethoxysiloxy-chlorodimethylsilane, ethoxydimethylsiloxy-chlorodimethylsilane, diethoxymethylsiloxy-chlorodimethylsilane, triethoxysiloxy-chlorodimethylsilane, chlorodimethylsiloxy-dichloromethylsilane, trichlorosiloxy-dichloromethylsilane, chlorodimethylsiloxy-trichlorosilane, dichloromethylsiloxy-trichlorosilane, and trichlorosiloxy-trichlorosilane.

The silane inorganic acid salt can be produced by adding the silane compound to the second inorganic acid, and then causing the mixture to react at a temperature of 20° C. to 300° C., and preferably 50° C. to 200° C. At this time, the reaction may be carried out while air and moisture are removed. When the reaction temperature is below 20° C., the silane compound may be crystallized, or the silane compound may be vaporized due to a low reaction rate. When the reaction temperature is above 300° C., the second inorganic acid may evaporate.

The second inorganic acid and the silane compound can be reacted at a proportion of 0.001 to 50 parts by weight, and preferably 0.01 to 30 parts by weight, of the silane compound with respect to 100 parts by weight of the second inorganic acid. When the amount of the silane compound reacted is less than 0.001 parts by weight, realization of the selectivity may be difficult due to the small content ratio of the silane compound, and when the amount is more than 50 parts by weight, the silane compound may be precipitated, or an amorphous structure may be produced.

Volatile side products that are generated at the time of reaction can be removed by distillation under reduced pressure. The product of the above-described reaction may be purified to separate the silane inorganic acid salt, and then this salt may be added to the composition for etching. Alternatively, it is also possible to add the reaction product to the composition for etching without purification.

The reaction can be carried out in the presence or absence of an aprotic solvent, and in the case of using an aprotic solvent, a solvent or solvent mixture having a boiling point or a boiling range up to 120° C. at 10,013 mbar can be preferably used. Examples of the solvent include dioxane, tetrahydrofuran, diethyl ether, diisopropyl ether, diethylene glycol dimethyl ether; chlorinated hydrocarbons, for example, dichloromethane, trichloromethane, tetrachloromethane, 1,2-dichloroethane, and trichloroethylene; hydrocarbons, for example, pentane, n-hexane, a mixture of hexane isomers, heptanes, octane, benzine, petroleum ether, benzene, toluene, and xylene; ketones, for example, acetone, methyl ethyl ketone, diisopropyl ketone, and methyl isobutyl ketone (MIBK); esters, for example, ethyl acetate, butyl acetate, propyl propionate, ethyl butyrate, ethyl isobutyrate, carbon disulfide, and nitrobenzene; and mixtures of these solvents.

As described above, since the silane inorganic acid salt is produced by reacting the second inorganic acid with the silane compound, the silane inorganic acid salt may be not a compound having a single chemical structure, but a mixture of silane inorganic acid salts having various chemical structures. That is, the silane inorganic acid salts may be a product resulting from alternate reactions between the second inorganic acid and the silane compound, or may be a mixture of silane inorganic acid salts having various chemical structures obtained as a result of reacting into a linear form or a branched form depending on the number and positions of halogen atoms in the silane compound.

Specific examples of the silane inorganic acid salts having various chemical structures include compounds of the following chemical formulas. However, the silane inorganic acid salt of the invention is not limited to the following chemical structures.

[Chemical Formula 51]
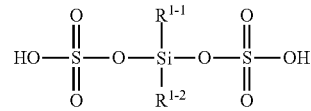
[Chemical Formula 52]
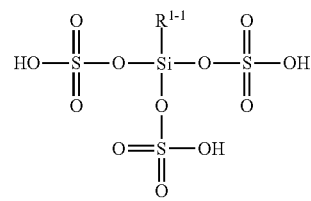
[Chemical Formula 53]
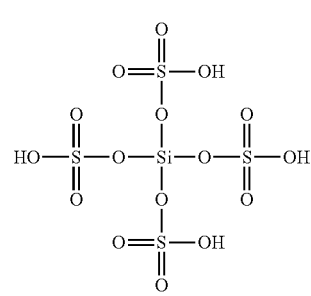
[Chemical Formula 54]
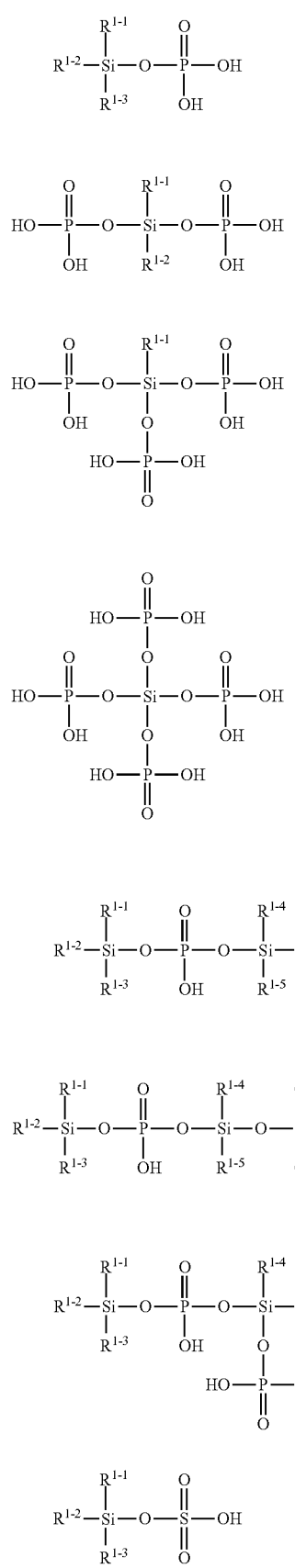
[Chemical Formula 55]
[Chemical Formula 56]
[Chemical Formula 57]
[Chemical Formula 61]
[Chemical Formula 62]
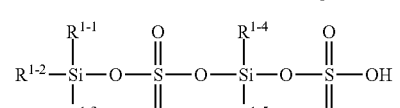
[Chemical Formula 63]
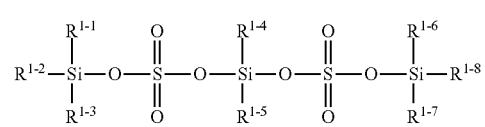
[Chemical Formula 64]
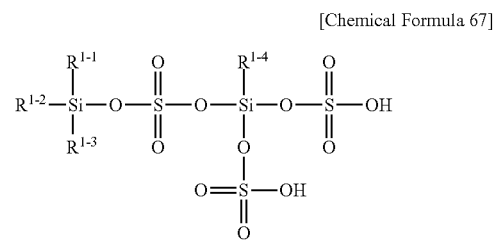
[Chemical Formula 65]
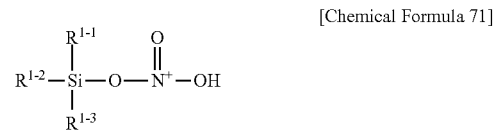
[Chemical Formula 66]
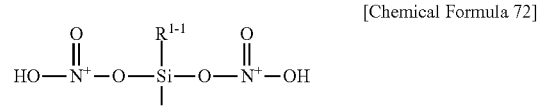
[Chemical Formula 67]
[Chemical Formula 71]
[Chemical Formula 72]
[Chemical Formula 73]
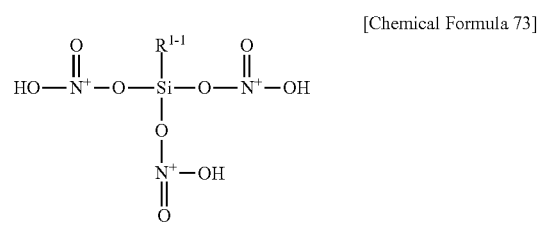

[Chemical Formula 74]

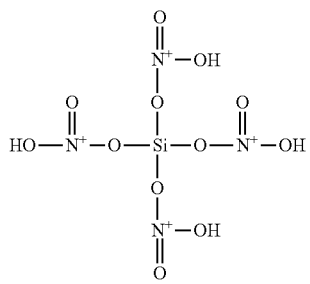

[Chemical Formula 75]

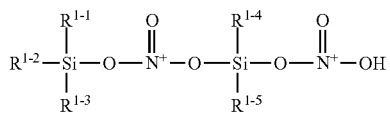

[Chemical Formula 76]

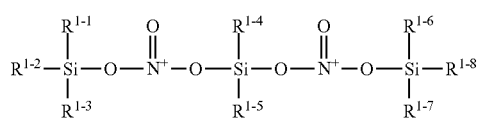

[Chemical Formula 77]

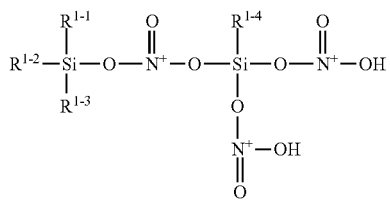

In Chemical Formulas 51 to 57, 61 to 67, and 71 to 77, $R^{1-1}$ to $R^{1-8}$ each independently represent any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms; and the halogen atom may be a fluoro group, a chloro group, a bromo group, or an iodo group, while the halogen atom is preferably a fluoro group or a chloro group.

The content of the silane inorganic acid salt is 0.01% to 15% by weight, preferably 0.5% to 15% by weight, more preferably 1% to 15% by weight, and more preferably 3% to 7% by weight, with respect to the total weight of the composition for etching. When the content of the silane inorganic acid salt is less than 0.01% by weight, a high etch selectivity for a nitride film cannot be obtained, and when the content is more than 15% by weight, it is difficult to expect a further increase in effect associated with an increase in the content, and there may rather be problems such as particle generation.

At this time, when the content of the silane inorganic acid salt is 0.7% by weight or more, the selectivity between the nitride etch rate (Å/min) and the oxide etch rate (Å/min) of the composition for etching may be 200:1 or greater (nitride etch rate:oxide etch rate), for example, 200:1, 200:5, or 200:10. When the content of the silane inorganic acid salt is 1.4% by weight or more, the selectivity between the nitride etch rate (Å/min) and the oxide etch rate (Å/min) of the composition for etching may be 200:infinity (nitride etch rate:oxide etch rate). Since the composition for etching has a feature of having high etch selectivity for a nitride film with respect to an oxide film as described above, the EFH can be easily regulated by regulating the etch rate for an oxide film.

According to another embodiment, the silane inorganic acid salt can be produced by reacting polyphosphoric acid with the silane compound represented by Chemical Formula 10. At this time, the silane inorganic acid salt can be represented by the following Chemical Formula 100.

[Chemical Formula 100]

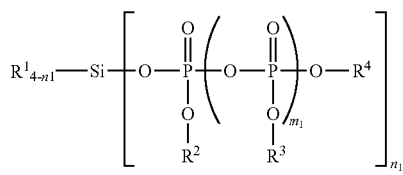

In Chemical Formula 100, $R^1$ represents any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms; and the halogen atom may be a fluoro group, a chloro group, a bromo group, or an iodo group, while the halogen atom is preferably a fluoro group or a chloro group.

$n_1$ represents an integer from 1 to 4, and $m_1$ represents an integer from 1 to 10.

$R^2$ to $R^4$ each represent a hydrogen atom. However, optionally, any one hydrogen atom selected from the group consisting of $R^2$ to $R^4$ may be substituted by a substituent represented by the following Chemical Formula 120.

[Chemical Formula 120]

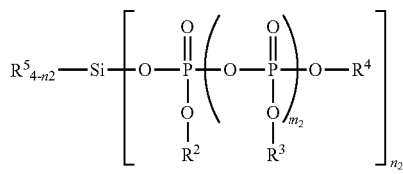

In Chemical Formula 120, any one of $R^5$'s represents a linking group linked to a structure represented by Chemical Formula 100, and the others each independently represent any one selected from a hydrogen atom, a halogen atom, an alkyl group having 1 to 10 carbon atoms, an alkoxy group having 1 to 10 carbon atoms, and an aryl group having 6 to 30 carbon atoms. That is, in a case in which there are four units of $R^5$, one of them is a linking group linked to a structure of Chemical Formula 100, and the other three may be each independently any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms. Furthermore, in a case in which there is only one unit of $R^5$, this $R^5$ represents a linking group linked to a structure of Chemical Formula 100.

$n_2$ represents an integer from 0 to 3, and $m_2$ represents an integer from 1 to 10.

In Chemical Formula 120, $R^2$ to $R^4$ may be each a hydrogen atom, or may be substituted by a second substituent represented by Chemical Formula 120. That is, a second substituent represented by Chemical Formula 120 may be substituted at any one of the $R^2$-position to the $R^4$-position, and a third substituent represented by Chemical Formula 120 may be substituted at any one of the $R^2$-position to $R^4$-position of the second substituent represented by Chemical Formula 120.

This is because the silane inorganic acid salt is a product produced by reacting the polyphopshoric acid with the silane compound. That is, the compound represented by Chemical Formula 100 is produced as a result of the reaction between the polyphosphoric acid and the silane compound, and a hydroxyl group at any one of the $R^2$-position to the $R^4$-position of a moiety derived from the polyphosphoric acid may react again with the silane compound, which is a reaction starting substance. Subsequently, the silane compound that has reacted with the compound represented by Chemical Formula 100 may react again with the polyphosphoric acid, which is a reaction starting substance, and such a reaction may proceed continuously.

An example of the silane inorganic acid salt resulting from the results of continuous proceeding of the reaction is as follows.

An example of the case in which in Chemical Formula 100, $n_1$ represents 1; $m_1$ represents 1; and $R^2$ to $R^4$ all represent a hydrogen atom may be equivalent to the following Chemical Formula 101. At this time, the definitions for $R^{1-1}$ to $R^{1-3}$ are the same as the definitions for $R^1$.

[Chemical Formula 101]

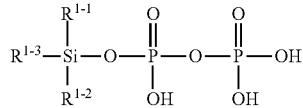

A compound represented by the following Chemical Formula 102 is the same as the compound represented by Chemical Formula 101, except that $m_1$ is 2.

[Chemical Formula 102]

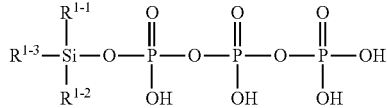

An example of the case in which in Chemical Formula 100, $n_1$ represents 2; $m_1$ represents 1; and $R^2$ to $R^4$ all represent a hydrogen atom may be equivalent to the following Chemical Formula 103. At this time, the definitions for $R^{1-1}$ and $R^{1-2}$ are the same as the definitions for $R^1$.

[Chemical Formula 103]

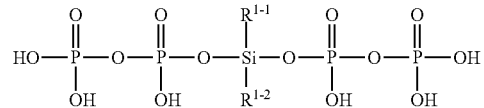

An example of the case in which in Chemical Formula 100, $n_1$ represents 1; $m_1$ represents 1; $R^2$ and $R^3$ both represent a hydrogen atom; and $R^4$ is substituted by a substituent represented by Chemical Formula 120, may be equivalent to the following Chemical Formula 104. In Chemical Formula 120, $n_2$ represents zero, and any one of $R^5$'s represents a linking group linked to a structure represented by Chemical Formula 100. At this time, the definitions for $R^{1-1}$ to $R^{1-6}$ are the same as the definitions for $R^1$. A compound represented by the following Chemical Formula 104 is a resultant product produced when the moiety derived from the polyphosphoric acid and having a substituent represented by $R^4$ in the compound represented by Chemical Formula 100 reacts again with the silane compound as a reaction starting substance.

[Chemical Formula 104]

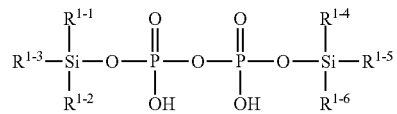

An example of the case in which in Chemical Formula 100, $n_1$ represents 1; $m_1$ represents 1; $R^3$ and $R^4$ each represent a hydrogen atom; and $R^2$ is substituted with a substituent represented by Chemical Formula 120, may be equivalent to the following Chemical Formula 105. In Chemical Formula 120, $n_2$ represents 1; $m_2$ represents 1; any one of $R^5$'s represents a linking group linked to a structure represented by Chemical Formula 100; and $R^2$ to $R^4$ all represent a hydrogen atom. At this time, the definitions for $R^{1-1}$ to $R^{1-5}$ are the same as the definitions for $R^1$ described above. A compound represented by the following Chemical Formula 105 is a resultant product produced when a hydroxyl group at any one of the $R^4$-position of a moiety derived from the polyphosphoric acid in the compound represented by Chemical Formula 100 reacts again with the silane compound as a reaction starting substance, and subsequently the silane compound that has reacted with the compound represented by Chemical Formula 100 reacts again with the polyphosphoric acid as a reaction starting substance.

[Chemical Formula 105]

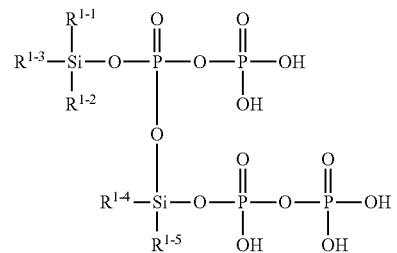

Compounds represented by the following Chemical Formula 106 and Chemical Formula 107 are the same as the compound represented by Chemical Formula 105, except that the position of the substituent represented by Chemical Formula 120 has been changed from the $R^2$-position of Chemical Formula 100 to the $R^3$-position and the $R^4$-position, respectively.

[Chemical Formula 106]

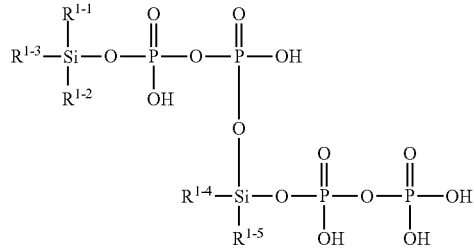

[Chemical Formula 107]

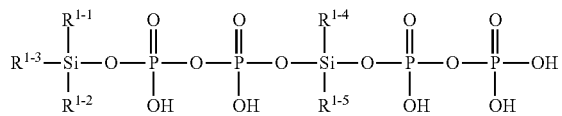

An example of the case in which in Chemical Formula 100, $n_1$ represents 1; $m_1$ represents 1; $R^2$ and $R^3$ each represent a hydrogen atom; $R^4$ is substituted by a substituent represented by Chemical Formula 120; and a second substituent represented by Chemical Formula 120 is substituted at the $R^4$-position of the substituent represented by Chemical Formula 120, may be equivalent to the following Chemical Formula 108. In Chemical Formula 120, $n_2$ represents 1, $m_2$ represents 1; any one of $R^5$'s represents a linking group linked to a structure represented by Chemical Formula 100; and $R^2$ and $R^3$ are hydrogen atoms. At this time, the definitions for $R^{1-1}$ to $R^{1-7}$ are the same as the definition for $R^1$ described above. A compound represented by the following Chemical Formula 108 is a resultant product produced when a hydroxyl group of a moiety derived from the polyphosphoric acid on the right-hand side terminal of the compound represented by Chemical Formula 107 reacts again with the silane compound as a reaction starting substance, and subsequently the silane compound that has reacted with the compound represented by Chemical Formula 107 reacts again with the polyphosphoric acid as a reaction starting substance.

[Chemical Formula 108]

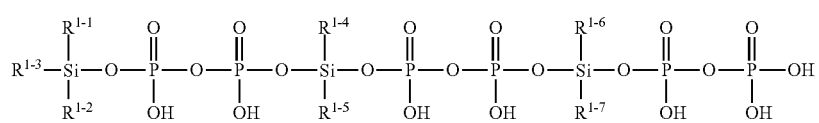

The present invention is not intended to be limited to the compounds exemplified by Chemical Formulas 101 to 108, and various modifications can be made based on the compounds described above as references.

Meanwhile, the silane compound that can react with the polyphosphoric acid and thereby produce the silane inorganic acid salt represented by Chemical Formula 100 may be a compound represented by Chemical Formula 10 described above. The details of the compound represented by Chemical Formula 10 are as described above.

The polyphosphoric acid may be pyrophosphoric acid containing two phosphorus atoms, or a polyphosphoric acid containing three or more phosphorus atoms.

The method of manufacturing the silane inorganic acid salt by reacting the polyphosphoric acid with the silane compound is the same as the method of manufacturing the silane inorganic acid salt by reacting the second inorganic acid with the silane compound, except that the polyphosphoric acid is used instead of the second inorganic acid.

According to an embodiment, the silane inorganic acid salt may be a siloxane inorganic acid salt produced by reacting any one second inorganic acid selected from the group consisting of phosphoric acid, phosphoric acid anhydride, pyrophosphoric acid, polyphosphoric acid, and mixtures thereof, with a siloxane compound represented Chemical Formula 20.

At this time, the siloxane inorganic acid salt may be represented by the following Chemical Formula 200.

[Chemical Formula 200]

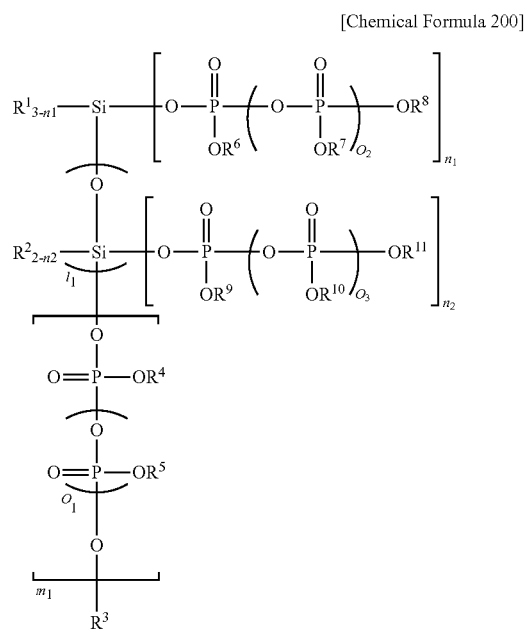

In Chemical Formula 200, $R^1$ and $R^2$ each independently represent any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms; and the halogen atom may be a fluoro group, a chloro group, a bromo group, or an iodo group, while the halogen atom is preferably a fluoro group or a chloro group.

$n_1$ represents an integer from 0 to 3; $n_2$ represents an integer from 0 to 2; $m_1$ represents an integer of 0 or 1; and the relation: $n_1+n_2+m_1 \geq 1$ is satisfied. That is, Chemical Formula 200 includes at least one atomic group derived from the second inorganic acid such as phosphoric acid.

$l_1$ represents an integer from 1 to 10; and $o_1$ to $o_3$ each independently represent an integer from 0 to 10.

$R^3$ to $R^{11}$ each represent a hydrogen atom. However, any one hydrogen atom selected from the group consisting of $R^3$ to $R^{11}$ may be selectively substituted by a substituent represented by the following Chemical Formula 220.

[Chemical Formula 220]

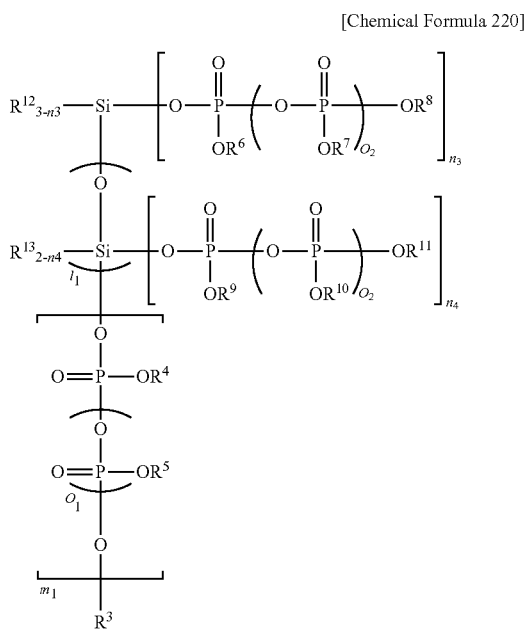

In Chemical Formula 220, any one of $R^{12}$'s and $R^{13}$'s represents a linking group linked to a structure represented by Chemical Formula 200, and the others each independently represent any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms. That is, in a case in which there are two units of $R^{12}$ and one unit of $R^{13}$, one of them may represent a linking group linked to a structure represented by Chemical Formula 200, and the other two may each independently represent any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms. Furthermore, in a case in which there is one unit of $R^{12}$ and zero units of $R^{13}$, $R^{12}$ is a linking group linked to a structure represented by Chemical Formula 200.

$n_3$ represents an integer from 0 to 3; $n_4$ represents an integer from 0 to 2; and $m_1$ represents an integer of 0 or 1. $l_1$ represents an integer from 1 to 10, and $o_1$ to $o_3$ each independently represent an integer from 0 to 10.

$R^3$ to $R^{11}$ may each independently represent a hydrogen atom or may be each independently substituted by a second substituent represented by Chemical Formula 220. That is, a second substituent represented by Chemical Formula 220 may be substituted at any one of the $R^3$-position to the $R^{11}$-position, and a third substituent represented by Chemical Formula 220 may also be substituted at any one of the $R^3$-position to the $R^{11}$-position of the second substituent represented by Chemical Formula 220.

This is because the siloxane inorganic acid salt is a product produced by reacting the second inorganic acid with the siloxane compound. That is, the second inorganic acid reacts with the siloxane compound, and a compound represented by Chemical Formula 200 described above is produced. A hydroxyl group at any one of the $R^3$-position to the $R^{11}$-position of a moiety derived from the second inorganic acid in the compound represented by Chemical Formula 200 can react again with the siloxane compound as a reaction starting substance, and subsequently, the siloxane compound that has reacted with the compound represented by Chemical Formula 200 can react again with the second inorganic acid as a reaction starting substance. Thus, these reactions can proceed continuously.

Resultant products of the siloxane inorganic acid salts according to the results of the successive progress of reactions are as follows.

An example of the case in which in Chemical Formula 200, $n_1$ represents 1; $n_2$ represents zero; m1 represents zero; $l_1$ represents 1; $o_1$ to $o_3$ each represent zero; and $R^3$ to $R^{11}$ all represent a hydrogen atom, may be equivalent to the following Chemical Formula 201. At this time, the definitions for $R^{1-1}$ and $R^{1-2}$ are the same as the definition for $R^1$ described above, and the definitions for $R^{2-1}$ and $R^{2-2}$ are the same as the definition for $R^2$ described above.

[Chemical Formula 201]

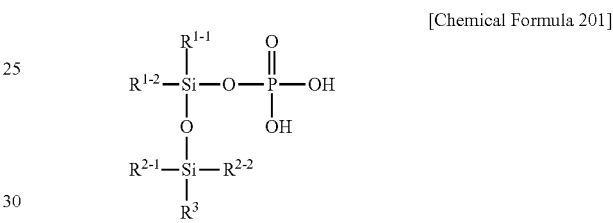

A compound represented by the following Chemical Formula 202 may be the same as the compound represented by Chemical Formula 201, except that $n_2$ is 1.

[Chemical Formula 202]

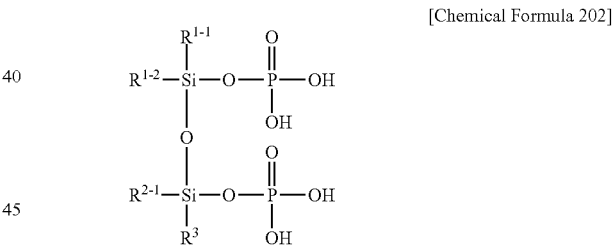

A compound represented by the following Chemical Formula 203 may be the same as the compound represented by Chemical Formula 201, except that $o_2$ and $o_3$ are both 1.

[Chemical Formula 203]

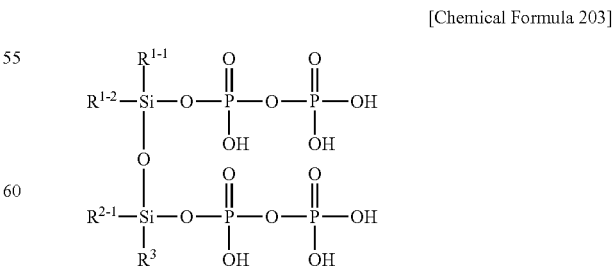

A compound represented by the following Chemical Formula 204 may be the same as the compound represented by Chemical Formula 202, except that $l_1$ is 2.

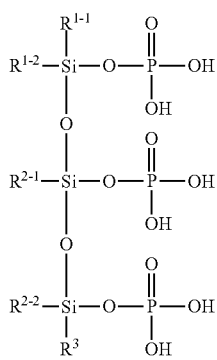

[Chemical Formula 204]

An example of the case in which in Chemical Formula 200, $n_1$ and $n_2$ each represent 2; $m_1$ represents zero; $l_1$ represents 1; $o_1$ to $o_3$ each represent zero; and $R^3$ to $R^{11}$ all represent a hydrogen atom, may be equivalent to the following Chemical Formula 205.

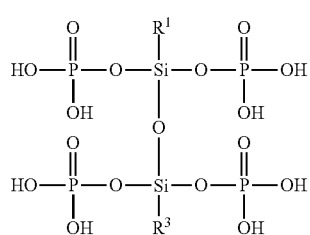

[Chemical Formula 205]

An example of the case in which in Chemical Formula 200, $n_1$ represents 1; $n_2$ represents 1; $m_1$ represents zero; $l_1$ represents 1; $o_1$ to $o_3$ each represent zero; $R^6$, $R^9$, and $R^{11}$ each represent a hydrogen atom; and $R^8$ is substituted by a substituent represented by Chemical Formula 220, may be equivalent to the following Chemical Formula 206. In Chemical Formula 220, $n_3$ and $n_4$ each represent zero; $m_1$ represents zero; $l_1$ represents 1; any one of $R^{12}$'s represents a linking group linked to a structure represented by Chemical Formula 200. At this time, the definitions for $R^{1-1}$ to $R^{1-7}$ are the same as the definition for $R^1$, and the definition for $R^{2-1}$ is the same as the definition for $R^2$. A compound represented by the following Chemical Formula 206 is a resultant product produced when a hydroxyl group at the $R^8$-position of a moiety derived from the second inorganic acid in the compound represented by Chemical Formula 200 reacts again with the siloxane compound as a reaction starting substance.

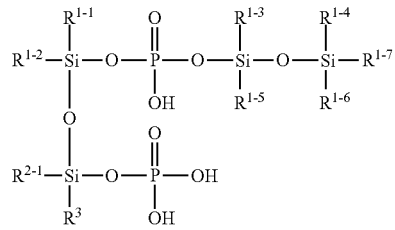

[Chemical Formula 206]

An example of the case in which in Chemical Formula 200, $n_1$ represents 1; $n_2$ represents 1; $m_1$ represents zero; $l_1$ represents 1; $o_1$ to $o_3$ each represent zero; $R^6$, $R^9$, and $R^{11}$ each represent a hydrogen atom; and $R^8$ is substituted by a substituent represented by Chemical Formula 220, may be equivalent to the following Chemical Formula 207. In Chemical Formula 220, $n_3$ and $n_4$ each represent 1; $m_1$ represents zero; $o_2$ and $o_3$ each represent zero; any one of $R^{12}$'s represents a linking group linked to a structure represented by Chemical Formula 200; and $R^6$, $R^8$, $R^9$, and $R^{11}$ each represent a hydrogen atom. At this time, the definitions for $R^{1-1}$ to $R^{1-3}$ are the same as the definition for $R^1$; the definitions for $R^{2-1}$ and $R^{2-2}$ are the same as the definition for $R^2$; and the definitions for $R^{3-1}$ and $R^{3-2}$ are the same as the definition for $R^3$. A compound represented by the following Chemical Formula 207 is a resultant product produced when a hydroxyl group at the $R^8$-position of a moiety derived from the second inorganic acid in the compound represented by Chemical Formula 200 reacts again with the siloxane compound as a reaction starting substance, and subsequently the siloxane compound that has reacted with the compound represented by Chemical Formula 200 reacts again with the second inorganic acid as a reaction starting substance.

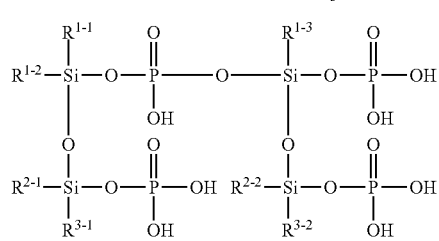

[Chemical Formula 207]

A compound represented by the following Chemical Formula 208 may be the same as the compound represented by Chemical Formula 207, except that the substituent represented by Chemical Formula 220 is linked to Chemical Formula 200 at the $R^{1-3}$-position of Chemical Formula 207.

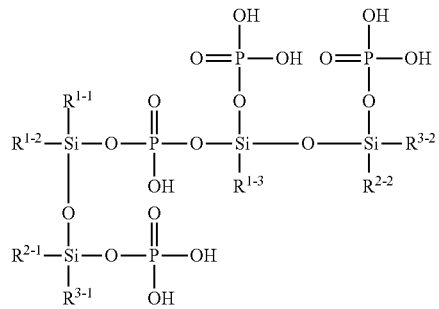

[Chemical Formula 208]

An example of the case in which in Chemical Formula 200, $n_1$ represents 1; $n_2$ represents 1; $m_1$ represents 0; $l_1$ represents 1; $o_1$ to $o_3$ each represent zero; $R^3$, $R^6$, $R^9$, and $R^{11}$ each represent a hydrogen atom; $R^8$ is substituted by a first substituent represented by Chemical Formula 220; and $R^8$ of the first substituent represented by Chemical Formula 220 is substituted by a second substituent represented by Chemical Formula 220, may be equivalent to the following Chemical Formula 209. In the first substituent represented by Chemical Formula 220, $n_3$ and $n_4$ each represent 1; $m_1$ represents zero; $l_1$ represents 1; $o_2$ and $o_3$ each represent zero; any one of $R^{12}$'s represents a linking group linked to a structure represented by Chemical Formula 200; $R^6$, $R^9$, and $R^{11}$ each represent a hydrogen atom; and $R^8$ represents a second substituent represented by Chemical Formula 220. In the second substituent represented by Chemical Formula 220, $n_3$ and $n_4$ each represent 1; $m_1$ represents 0; $1_1$ represents 1; $o_2$ and $o_3$ each represent zero; any one of $R^{12}$'s represents a linking group linked to the first substituent represented by Genera Formula 220; and $R^6$, $R^8$, $R^9$, and $R^{11}$ each represent a hydrogen atom. At this time, the definitions for $R^{1-1}$ to $R^{1-4}$ are the same as the definition for $R^1$; the definitions for $R^{2-1}$ to $R^{2-3}$ are the same as the definition for $R^2$; and the definitions for $R^{3-1}$ to $R^{3-3}$ are the same as the definition for $R^3$.

A compound represented by the following Chemical Formula 209 is a resultant product produced when a moiety derived from the second inorganic acid at the right-hand side end of the compound represented by Chemical Formula 207, is reacted again with the siloxane compound as a reaction starting substance, and subsequently the siloxane compound that has reacted with the compound represented by Chemical Formula 207 reacts again with the second inorganic acid as a reaction starting substance.

[Chemical Formula 209]

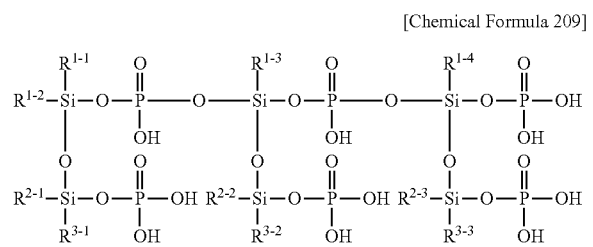

A compound represented by the following Chemical Formula 210 may be the same as the compound represented by Chemical Formula 209, except that the second substituent represented by Chemical Formula 220 is linked to a structure represented by Chemical Formula 200 at the $R^{1-4}$-position of Chemical Formula 209.

[Chemical Formula 210]

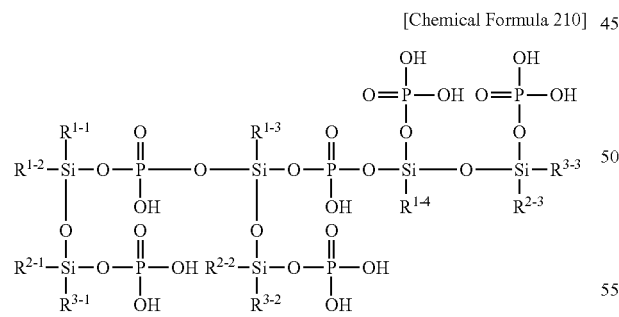

The present invention is not intended to be limited to the compounds represented by Chemical Formulas 201 to 210, and various modifications can be made based on the compounds described above.

According to an embodiment, the silane inorganic acid salt may be a siloxane inorganic acid salt produced by reacting any one second inorganic acid selected from the group consisting of sulfuric acid, fuming sulfuric acid, and a mixture thereof, with the siloxane compound represented by Chemical Formula 20.

At this time, the siloxane inorganic acid salt may be represented by the following Chemical Formula 230.

[Chemical Formula 230]

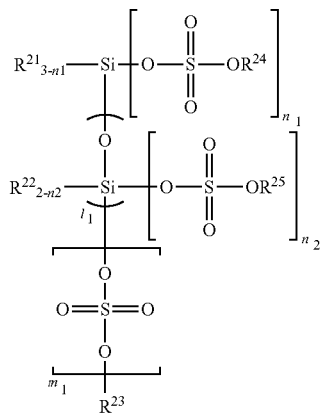

In Chemical Formula 230, $R^{21}$ and $R^{22}$ each independently represent any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms; and the halogen atom may be a fluoro group, a chloro group, a bromo group, or an iodo group, while the halogen atom is preferably a fluoro group or a chloro group.

$n_1$ represents an integer from 0 to 3; $n_2$ represents an integer from 0 to 2; $m_1$ represents an integer of 0 or 1; and the relation: $n_1+n_2+m_1 \geq 1$ is satisfied. That is, Chemical Formula 230 contains at least one atomic group derived from the second inorganic acid such as sulfuric acid.

$1_1$ represents an integer from 1 to 10.

$R^{23}$ to $R^{25}$ each represent a hydrogen atom. However, any one hydrogen selected from the group consisting of $R^{23}$ to $R^{25}$ may be selectively substituted by a substituent represented by the following Chemical Formula 250.

[Chemical Formula 250]

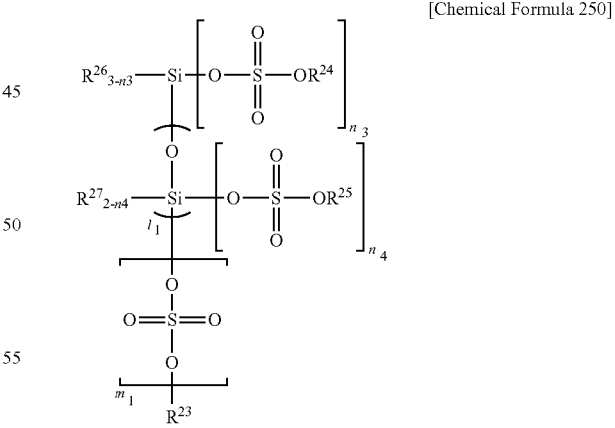

In Chemical Formula 250, any one of $R^{26}$'s and $R^{27}$'s represents a linking group linked to a structure represented by Chemical Formula 230; and the others each independently represent any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms. That is, in a case in which there are two units of $R^{26}$ and one unit of $R^{27}$, one of them may represent a linking group linked to a structure represented by Chemical Formula 230, and the other two may each independently represent any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms. Furthermore, in a case in which there are one unit of $R^{26}$ and zero units of $R^{27}$, $R^{26}$ is a linking group linked to a structure represented by Chemical Formula 230.

$n_3$ represents an integer from 0 to 3; $n_4$ represents an integer from 0 to 2; $m_1$ represents an integer of 0 or 1; and $1_1$ represents an integer from 1 to 10.

$R^{23}$ to $R^{25}$ may each independently represent a hydrogen atom, or may be substituted by a second substituent represented by Chemical Formula 250. That is, a second substituent represented by Chemical Formula 250 may be substituted at any one of the $R^{23}$-position to $R^{25}$-position, and a third substituent represented by Chemical Formula 250 may be substituted again at any one of the $R^{23}$-position to $R^{25}$-position.

When examples of the resultant products of the siloxane inorganic acid salt obtained by the successive progress of reactions as described above are listed similarly to the cases of Chemical Formulas 201 to 210, the examples include compounds represented by the following Chemical Formulas 231 to 239. At this time, in the following Chemical Formulas 231 to 239, the definitions for $R^{11-1}$ to $R^{11-7}$ are the same as the definition for $R^{11}$; the definitions for $R^{12-1}$ to $R^{12-3}$ are the same as the definition for $R^{12}$; and the definitions for $R^{13-1}$ to $R^{13-3}$ are the same as the definition for $R^{13}$.

[Chemical Formula 231]

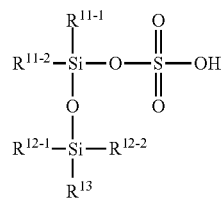

[Chemical Formula 232]

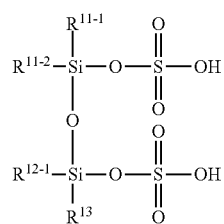

[Chemical Formula 233]

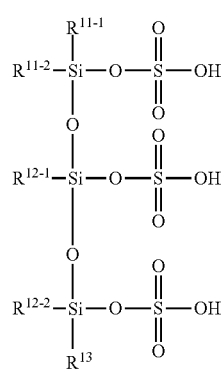

[Chemical Formula 234]

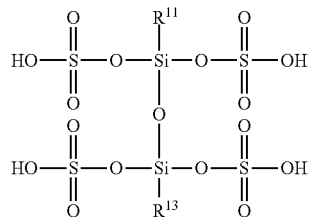

[Chemical Formula 235]

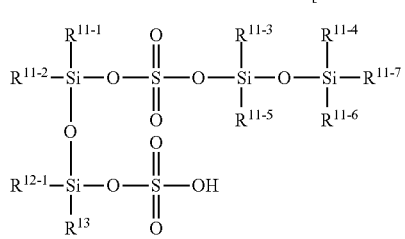

[Chemical Formula 236]

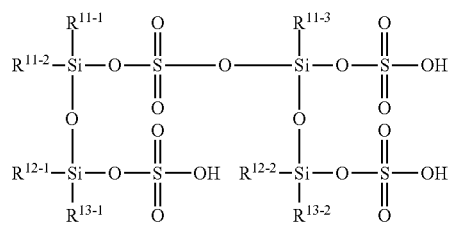

[Chemical Formula 237]

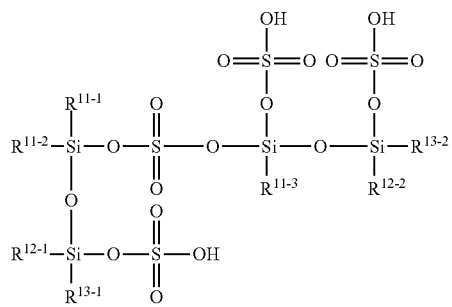

[Chemical Formula 238]

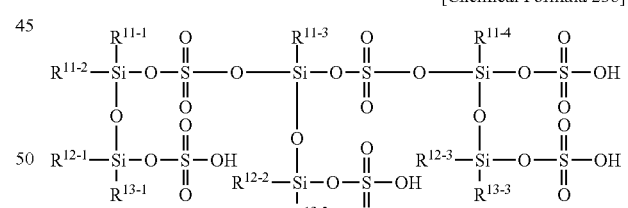

[Chemical Formula 239]

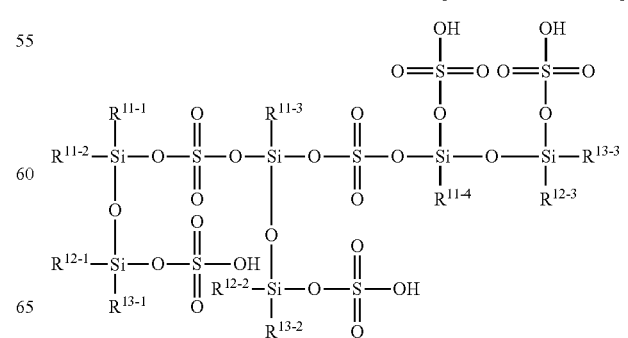

The present invention is not limited to the compounds listed above as examples of Chemical Formulas 231 to 239, and various modifications can be made based on the above-described compounds as references.

According to another embodiment, the silane inorganic acid salt may be a siloxane inorganic acid salt produced by reacting a second inorganic acid including nitric acid with the siloxane compound represented by Chemical Formula 20.

At this time, the siloxane inorganic acid salt may be represented by the following Chemical Formula 260.

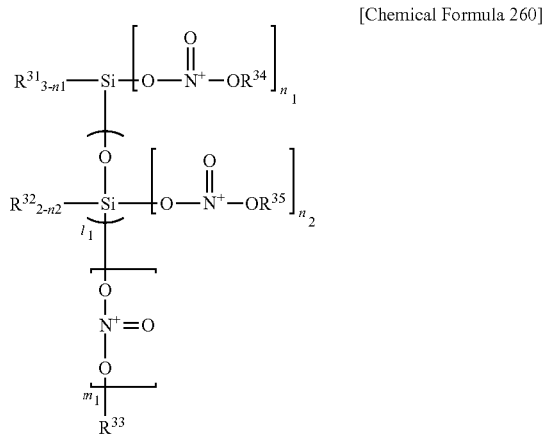

[Chemical Formula 260]

In Chemical Formula 260, $R^{31}$ and $R^{32}$ each independently represent any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms; and the halogen atom may be a fluoro group, a chloro group, a bromo group, or an iodo group, while the halogen atom is preferably a fluoro group or a chloro group.

$n_1$ represents an integer from 0 to 3; $n_2$ represents an integer from 0 to 2; $m_1$ represents an integer of 0 or 1; and the relation: $n_1+n_2+m_1 \geq 1$ is satisfied. That is, Chemical Formula 260 contains at least one atomic group derived from the second inorganic acid including nitric acid.

$1_1$ represents an integer from 1 to 10.

$R^{33}$ to $R^{35}$ each independently represent a hydrogen atom. However, any one hydrogen selected from the group consisting of $R^{33}$ to $R^{35}$ may be selectively substituted by a substituent represented by the following Chemical Formula 280.

In Chemical Formula 280, any one of $R^{36}$'s and $R^{37}$'s represents a linking group linked to a structure represented by Chemical Formula 260, and the others each independently represent any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms. That is, in a case in which there are two units of $R^{36}$ and one unit of $R^{37}$, one of them may represent a linking group linked to a structure represented by Chemical Formula 260, and the other two may each independently represent any one selected from the group consisting of a hydrogen atom, a halogen atom, an alkyl group having 1 to 10 carbon atoms, an alkoxy group having 1 to 10 carbon atoms, and an aryl group having 6 to 30 carbon atoms. Furthermore, in a case in which there is one unit of $R^{36}$ and zero units of $R^{37}$, $R^{36}$ represents a linking group linked to a structure represented by Chemical Formula 260.

$n_3$ represents an integer from 0 to 3; $n_4$ represents an integer from 0 to 2; $m_1$ represents an integer of 0 or 1; and $1_1$ represents an integer from 1 to 10.

$R^{33}$ to $R^{35}$ may each independently represent a hydrogen atom, or may be each substituted by a second substituent represented by Chemical Formula 280. That is, the second substituent represented by Chemical Formula 280 may be substituted at any one of the $R^{33}$-position to the $R^{35}$-position, and a third substituent represented by Chemical Formula 280 may be substituted again at any one of the $R^{33}$-position to the $R^{35}$-position of the second substituent represented by Chemical Formula 280.

When examples of the resultant products of the siloxane inorganic acid salt obtained by the successive progress of reactions as described above are listed similarly to the cases of Chemical Formulas 201 to 210, the examples include compounds represented by the following Chemical Formulas 261 to 269. At this time, in the following Chemical Formulas 261 to 269, the definitions for $R^{21-1}$ to $R^{21-7}$ are the same as the definition for $R^{21}$; the definitions for $R^{22-1}$ to $R^{22-3}$ are the same as the definition for $R^{22}$; and the definitions for $R^{23-1}$ to $R^{23-3}$ are the same as the definition for $R^{23}$.

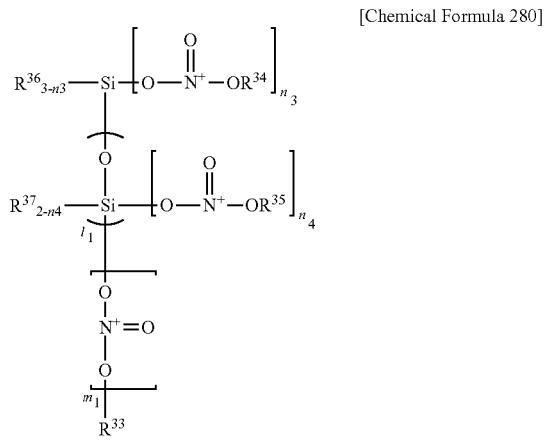

[Chemical Formula 280]

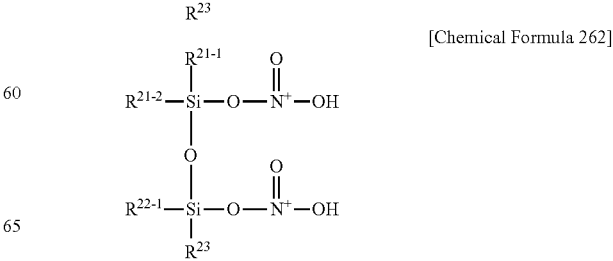

[Chemical Formula 261]

[Chemical Formula 262]

[Chemical Formula 263]
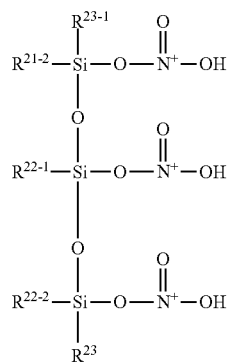

[Chemical Formula 264]
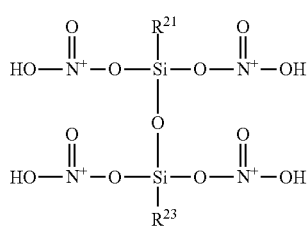

[Chemical Formula 265]
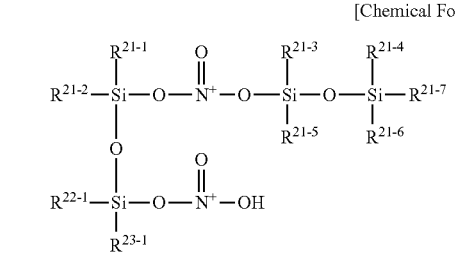

[Chemical Formula 266]
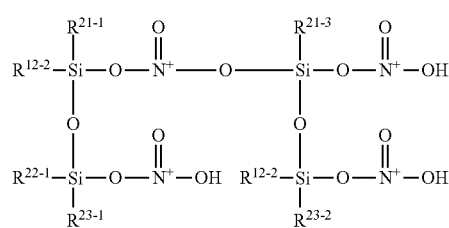

[Chemical Formula 267]
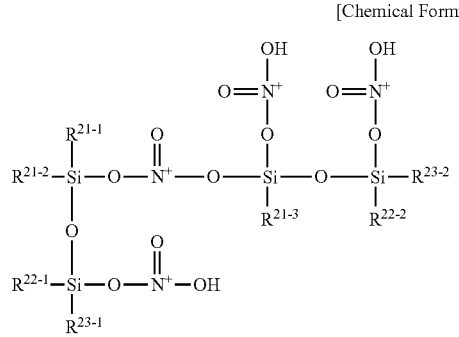

[Chemical Formula 268]
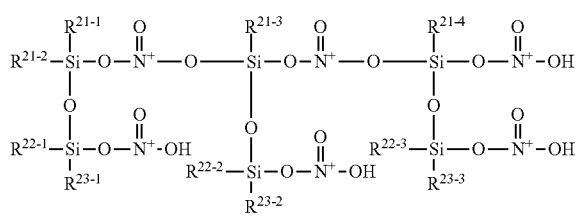

[Chemical Formula 269]
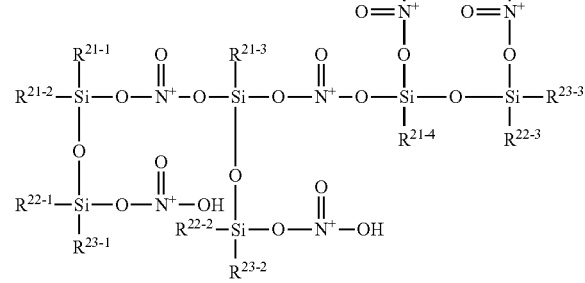

The present invention is not intended to be limited to the compounds listed as examples of Chemical Formulas 261 to 269, and various modifications can be made based on the above-described compounds as references.

Meanwhile, the siloxane compound that can react with the second inorganic acid and produce the siloxane inorganic acid salt represented by Chemical Formula 200 may be a compound represented by the following Chemical Formula 20. The details of the compound represented by Chemical Formula 20 are as described above.

The method of manufacturing the siloxane inorganic acid salt by reacting the second inorganic acid with a siloxane compound is the same as the method of manufacturing the silane inorganic acid salt by reacting the second inorganic acid with a silane compound, except that a siloxane compound is used instead of a silane compound.

Furthermore, the second additive may include an alkoxysilane compound represented by the following Chemical Formula 300.

[Chemical Formula 300]
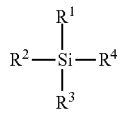

In Chemical Formula 300, $R^1$ to $R^4$ each independently represent any one selected from the group consisting of a hydrogen atom, a halogen atom, a hydroxyl group, an alkyl group having 1 to 10 carbon atoms, an alkoxy group having 1 to 10 carbon atoms, an aminoalkyl group having 1 to 10 carbon atoms, an aminoalkoxy group having 1 to 10 carbon atoms, and an aryl group having 6 to 30 carbon atoms; and any one of $R^1$ to $R^4$ represents an alkoxy group having 1 to 10 carbon atoms, an aminoalkyl group having 1 to 10 carbon atoms, or an aminoalkoxy group having 1 to 10 carbon atoms.

Specifically, the alkoxysilane compound represented by Chemical Formula 300 may be any one selected from the group consisting of tetramethoxysilane (TMOS), tetrapropoxysilane, methyltrimethoxysilane (MTMOS), methyltriethoxysilane (MTEOS), methyltripropoxysilane, ethyltrimethoxysilane, ethyltriethoxysilane, ethylthripropoxysilane, propyltrimethoxysilane (PrTMOS), propyltriethoxysilane (PrTEOS), propyltripropoxysilane, dimethyldimethoxysilane, dimethyldiethoxysilane, dimethyldipropoxysilane, diethyldimethoxysilane, diethyldiethoxysilane, diethyldipropoxysilane, dipropyldimethoxysilane, dipropyldiethoxysilane, dipropyldipropoxysilane, trimethylmethoxysilane, trimethylethoxysilane, trimethylpropoxysilane, triethylmethoxysilane, triethylethoxysilane, triethylpropoxysilane, tripropylmethoxysilane, tripropylethoxysilane, tripropylpropoxysilane, 3-chloropropyltrimethoxysilane, 3-aminopropyltrimethoxysilane, 3-aminopropyltriethoxysilane, [3-(2-aminoethyl)aminopropyl]trimethoxysilane, 3-mercaptopropyltrimethoxysilane, 3-methacryloxypropyltrimethoxysilane, 3-acryloxypropyltrimethoxysilane, and mixtures thereof. Furthermore, the alkoxysilane compound represented by Chemical Formula 300 may be any one selected from the group consisting of butyl(methoxy)dimethylsilane, 3-cyanopropyldimethylmethoxysilane, trimethylethoxysilane, trimethylmethoxysilane, hexyldimethoxysilane, methyldiethoxysilane, 4-aminobutyldimethylmethoxysilane, 3-aminopropyldimethylethoxysilane, butyltrimethoxysilane, ethyltriethoxysilane, isobutyltriethoxysilane, methyltrimethoxysilane, tetramethoxysilane, tetraethoxysilane, triethoxysilane, butyltriethoxysilane, trimethylpentylsilane, 3-(2-aminoethyl)aminopropyltrimethoxysilane, 3-aminopropyltriethoxysilane, tris(dimethylamino)silane, and mixtures thereof.

Furthermore, the second additive may include a siloxane compound represented by the following Chemical Formula 350.

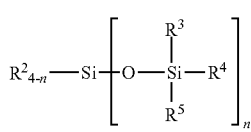

[Chemical Formula 350]

In Chemical Formula 350, $R^2$ to $R^5$ each independently represent any one selected from the group consisting of a hydrogen atom, a halogen atom, a hydroxyl group, an alkyl group having 1 to 10 carbon atoms, an alkoxy group having 1 to 10 carbon atoms, an aminoalkyl group having 1 to 10 carbon atoms, an aminoalkoxy group having 1 to 10 carbon atoms, and an aryl group having 6 to 30 carbon atoms; at least any one of $R^2$ to $R^5$ represents an alkoxy group having 1 to 10 carbon atoms, an aminoalkyl group having 1 to 10 carbon atoms, or an aminoalkoxy group having 1 to 10 carbon atoms; and n represents an integer from 1 to 4.

Specifically, the siloxane compound represented by Chemical Formula 350 may be any one selected from the group consisting of tris(trimethylsiloxy)silane, tetrakis(trimethylsiloxy)silane, (aminopropyl)tris(trimethylsiloxy)silane, (aminopropyl)tris(diethylaminosiloxy)silane, (aminopropyl)tris(methylethylaminosiloxy)silane, tris(trimethylsiloxy)methylsilane, tris(diethylaminosiloxy)methylsilane, tris(methylethylaminosiloxy)methylsilane, and mixtures thereof.

In the alkoxysilane compound represented by Chemical Formula 300 or the siloxane compound represented by Chemical Formula 350, the bond between a silicon atom and an oxygen atom is unstable, and the bond is likely to be easily broken. However, in a case in which the alkoxysilane compound represented by Chemical Formula 300 or the siloxane compound represented by Chemical Formula 350 contains an amino group, the atomic group containing an amino group can stabilize the bond between a silicon atom and an oxygen atom. That is, the production of reaction side products that may be generated as a result of breakage of the unstable bond between a silicon atom and an oxygen atom can be minimized. Therefore, the amount of particles produced during the etching process can be minimized, and the defects that may occur in the subsequent processes due to particles can be minimized.

Furthermore, the oxygen atoms included in the alkoxysilane compound represented by Chemical Formula 300 or the siloxane compound represented by Chemical Formula 350 can be bonded to the surface of an oxide film and protect the oxide film. For instance, the oxygen atoms included in the alkoxysilane compound represented by Chemical Formula 300 or the siloxane compound represented by Chemical Formula 350 form hydrogen bonding with the surface of an oxide film, and thus, an oxide film being etched while a nitride is being etched can be minimized. Therefore, the etch selectivity for a nitride film with respect to an oxide film can be increased.

Furthermore, the second additive may include an oxime compound represented by the following Chemical Formula 400. When the composition for etching includes the oxime compound represented by Chemical Formula 400, the etch rate for a silicon oxide film can be minimized, and satisfactory etch rate and etch speed for a silicon nitride film can be secured. That is, when a silicon nitride film and a silicon oxide film layer exist together, an effect of etching only the silicon nitride film while hardly affecting the silicon oxide film by etching, can be obtained. Furthermore, in the case of using the oxime compound represented by the Chemical Formula 400 together with the alkoxysilane compound represented by Chemical Formula 300 or the siloxane compound represented by Chemical Formula 350, the solubility of these compounds can be increased.

[Chemical Formula 400]

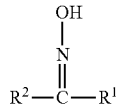

In Chemical Formula 400, $R^1$ and $R^2$ each independently represent any one selected from the group consisting of a hydrogen atom, a halogen atom, an alkyl group having 1 to 20 carbon atoms, an alkoxy group having 1 to 20 carbon atoms, an alkenyl group having 2 to 20 carbon atoms, a cycloalkyl group having 3 to 20 carbon atoms, an aminoalkyl group having 1 to 20 carbon atoms, an aryl group having 6 to 20 carbon atoms, an alkylcarbonyl group having 1 to 20 carbon atoms, an alkylcarbonyloxy group having 1 to 20 carbon atoms, and a cyanoalkyl group having 1 to 10 carbon atoms.

Specifically, the oxime compound may be any one selected from the group consisting of acetone oxime, 2-butanone oxime, acetaldehyde oxime, cyclohexanone oxime, acetophenone oxime, cyclodecanone oxime, and mixtures thereof.

The second additive may include an oxime silane compound represented by the following Chemical Formula 500. In a case in which the composition for etching includes the oxime silane compound represented by Chemical Formula 500, the etch rate for a silicon oxide film can be minimized, and satisfactory etch rate and etch speed for a silicon nitride film can be secured. That is, when a silicon nitride film and a silicon oxide film layer exist together, an effect of etching only the silicon nitride film while hardly affecting the silicon oxide film by etching, can be obtained. Furthermore, high etch rate and etch selectivity can be obtained compared to conventional compositions for etching, and even in the case of being used for a long time period, there is no problem with a decrease in the etch rate for a silicon nitride film. Thus, the composition for etching can be effectively applied at the time of producing semiconductor devices for which selective etching of silicon nitride films is needed.

[Chemical Formula 500]

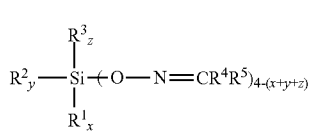

In Chemical Formula 500, $R^1$ to $R^3$ each independently represent any one selected from the group consisting of a hydrogen atom, a halogen atom, an alkyl group having 1 to 20 carbon atoms, an alkenyl group having 2 to 20 carbon atoms, a cycloalkyl group having 3 to 20 carbon atoms, an aryl group having 6 to 20 carbon atoms, an arylalkyl group having 7 to 20 carbon atoms, and an alkylcarbonyl group having 1 to 20 carbon atoms.

More specifically, $R^1$ to $R^3$ may each independently represent a hydrogen atom, a methyl group, an ethyl group, a n-propyl group, an isopropyl group, a n-butyl group, a tert-butyl group, a pentyl group, a hexyl group, a vinyl group, an acetyl group, a benzyl group, or a phenyl group.

In Chemical Formula 500, $R^4$ and $R^5$ may each independently represent any one selected from the group consisting of an alkyl group having 1 to 20 carbon atoms, a cycloalkyl group having 3 to 20 carbon atoms, an aryl group having 6 to 20 carbon atoms, an arylalkyl group having 7 to 20 carbon atoms, and an alkylcarbonyl group having 1 to 20 carbon atoms, or $R^4$ and $R^5$ may be linked to each other as an alkylene group having 3 to 12 carbon atoms and form an alicyclic ring.

More specifically, $R^4$ and $R^5$ may each independently represent a methyl group, an ethyl group, a n-propyl group, an isopropyl group, a n-butyl group, a tert-butyl group, a pentyl group, a hexyl group, a benzyl group, or a phenyl group, or $R^4$ and $R^5$ may be fused together and form a cyclohexyl group.

In Chemical Formula 500, x, y, and z each independently represent an integer from 0 to 3, and x+y+z represents an integer from 0 to 3.

Specifically, the oxime silane compound may be any one selected from the group consisting of di(ethyl ketoxime) silane, mono(ethy ketoxime)silane, tris(ethyl ketoxime)silane, tetra(ethyl ketoxime)silane, methyl tris(methyl ethyl ketoxime)silane, methyl tris(acetoxime)silane, methyl tris(methyl isobutyl ketoxime)silane, dimethyl di(methyl ethyl ketoxime)silane, trimethyl (methyl ethyl ketoxime)silane, tetra(methyl ethyl ketoxime)silane, tetra(methyl isobutyl ketoxime)silane, vinyl tris(methyl ethyl ketoxime)silane, methyl vinyl di(methyl ethyl ketoxime)silane, vinyl tris(methyl isobutyl ketoxime)silane, and phenyl tris(methyl ethyl ketoxime)silane.

Meanwhile, the first inorganic acid is added as an etching agent for etching a nitride film, and any inorganic acid capable of etching a nitride film can be used. For example, any one selected from the group consisting of sulfuric acid, nitric acid, phosphoric acid, silicic acid, hydrofluoric acid, boric acid, hydrochloric acid, perchloric acid, and mixtures thereof can be used.

Phosphoric acid can be used as the first inorganic acid in order to obtain preferable etch selectivity for a nitride film with respect to an oxide film. This phosphoric acid can play the role of supplying hydrogen ions into the composition for etching and thereby accelerating etching. In the case of using phosphoric acid as the first inorganic acid, the composition for etching may further include sulfuric acid as an additive. This sulfuric acid may be helpful in etching of a nitride film by elevating the boiling point of the composition for etching including phosphoric acid as the first inorganic acid.

The content of the first inorganic acid may be 70% to 99% by weight, preferably 70% to 90% by weight and more preferably 75% to 85% by weight, with respect to the total weight of the composition for etching. When the first inorganic acid is included at a proportion of less than 70% by weight, a nitride film may not be easily removed, and there is a risk that particle generation may occur. When the first inorganic acid is included at a proportion of more than 99% by weight, high selectivity for a nitride film cannot be obtained.

The composition for etching may include a solvent as the balance of the above-mentioned components. The solvent may be specifically water, deionized water, or the like.

The composition for etching may further include an ammonium-based compound at a proportion of 0.01% to 20% by weight with respect to the total amount of the composition for etching. In a case in which the composition for etching further includes the ammonium-based compound, even if the composition for etching is used for a long time period, no change occurs in the etching rate and etch selectivity, and there is an effect of maintaining the etch rate constant.

When the ammonium-based compound is added in an amount of less than 0.01% by weight, the effect of maintaining etch selectivity at the time of using the composition for etching for a long time period is reduced. When the ammonium-based compound is added in an amount of more than 20% by weight, the etch rates for a nitride film and a silicon oxide film are changed, and the etch selectivity may be changed.

Regarding the ammonium-based compound, any one selected from an aqueous ammonia solution, ammonium chloride, ammonium acetate, ammonium phosphate, ammonium peroxydisulfate, ammonium sulfate, and ammonium hydrofluoride, or a mixture of two or more kinds thereof can be used. Furthermore, the ammonium-based compound is not limited to the above-described compounds, and any compound containing ammonium ion can all be used. For example, as the ammonium-based compound, $NH_3$ and HCl may be used together.

The composition for etching may further include a fluorine-based compound at a proportion of 0.01% to 1% by weight with respect to the total amount of the composition for etching. When the fluorine-based compound is added in an amount of less than 0.01% by weight, the etch rate for a nitride film is reduced, and the removal of a nitride film may become difficult. When the fluorine-based compound is added in an amount of more than 1% by weight, the etch rate for a nitride film is significantly increased; however, there is a disadvantage that an oxide film is also etched.

Regarding the fluorine-based compound, any one selected from hydrogen fluoride, ammonium fluoride, and ammonium hydrogen fluoride, or a mixture of two or more kinds thereof can be used. More preferably, it is desirable to use ammonium hydrogen fluoride because the etch selectivity is maintained upon long-term use.

Meanwhile, the composition for etching may further include any optional additives that are conventionally used in the pertinent art in order to enhance the etching performance. Examples of the additives that can be used include a surfactant, a chelating agent, and a corrosion inhibitor.

Since the composition for etching includes the silane inorganic acid salt described above, the composition for etching can show markedly high etch selectivity for a nitride film with respect to an oxide film, and therefore, the composition for etching can be used for a nitride film etching process.

Accordingly, etching of an oxide film can be minimized in an etching process, and thus the EFH can be regulated easily. Furthermore, on the occasion of etch-selective removal of a nitride film, deterioration of electrical characteristics caused by any damage to the film quality of an oxide film or etching of an oxide film is prevented, and particle generation is prevented. Thus, the device characteristics can be enhanced.

A method of manufacturing a semiconductor device according to another aspect of the present invention includes an etching process carried out by using the composition for etching described above.

According to an embodiment, such an etching process involves etching of a nitride film, and more particularly, selective etching of a nitride film with respect to an oxide film.

The nitride film may include silicon nitride films, for example, a SiN film and a SiON film.

Furthermore, the oxide film may be a silicon oxide film, for example, at least one or more films selected from the group consisting of a spin-on-dielectric (SOD) film, a high-density plasma (HDP) film, a thermal oxide film, a boro-phosphate silicate glass (BPSG) film, a phosphosilicate glass (PSG) film, a borosilicate glass (BSG) film, a polysilazane (PSZ) film, a fluorinated silicate glass (FSG) film, a low-pressure tetraethyl orthosilicate (LP-TEOS) film, a plasma-enhanced tetraethyl orthosilicate (PETEOS) film, a high temperature oxide (HTO) film, a medium temperature oxide (MTO) film, an undoped silicate glass (USG) film, a spin-on-glass (SOG) film, an advanced planarization layer (APL) film, an atomic layer deposition (ALD) film, a plasma-enhanced oxide (PE-oxide) film, an O3-tetraethyl orthosilicate (O3-TEOS) film, and combinations thereof.

An etching process of using the above-described composition for etching can be carried out by any well-known wet etching method, for example, an immersion method or a spraying method.

During the etching process, the process temperature may be adjusted to the range of 50° C. to 300° C., and preferably 100° C. to 200° C., and the optimum temperature can be changed as necessary, in consideration of other processes and other factors.

According to a method of manufacturing a semiconductor device, which includes an etching process carried out using the composition for etching described above, in a case in which nitride films and oxide films are alternately laminated or exist as a mixture, selective etching for nitride films is enabled. Furthermore, particle generation, which has been a problem in conventional etching processes, can be prevented, and process stability and reliability can be secured.

Therefore, such a method can be efficiently applied to various operations where selective etching for a nitride film with respect to an oxide film is needed, in a semiconductor device production process.

Figure 3:
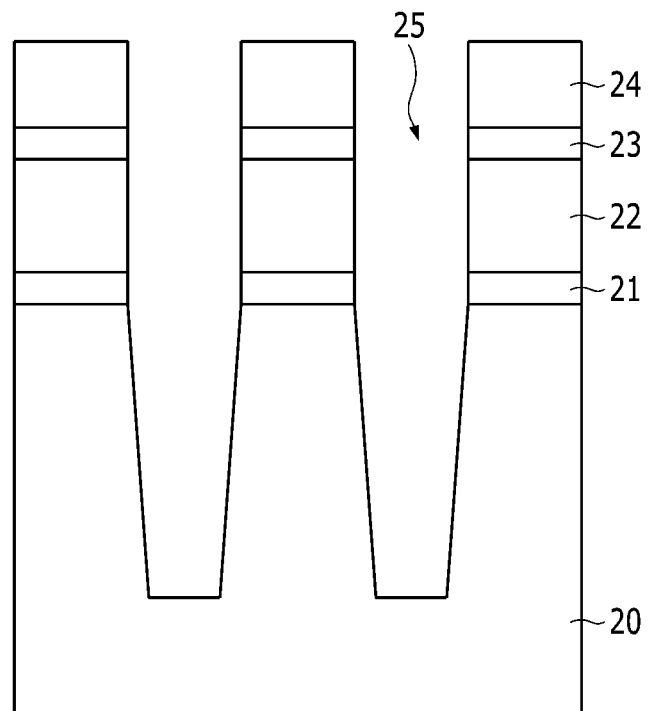
FIG. 3 to FIG. 5 are process cross-sectional views for explaining a device separation process for a flash memory device, including an etching process of using a composition for etching according an embodiment of the invention.
Figure 4:
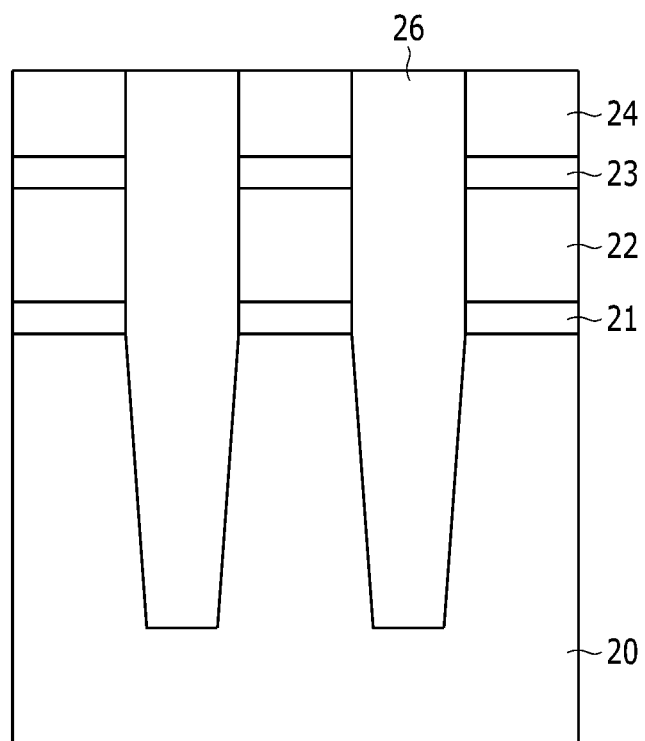
Figure 5:
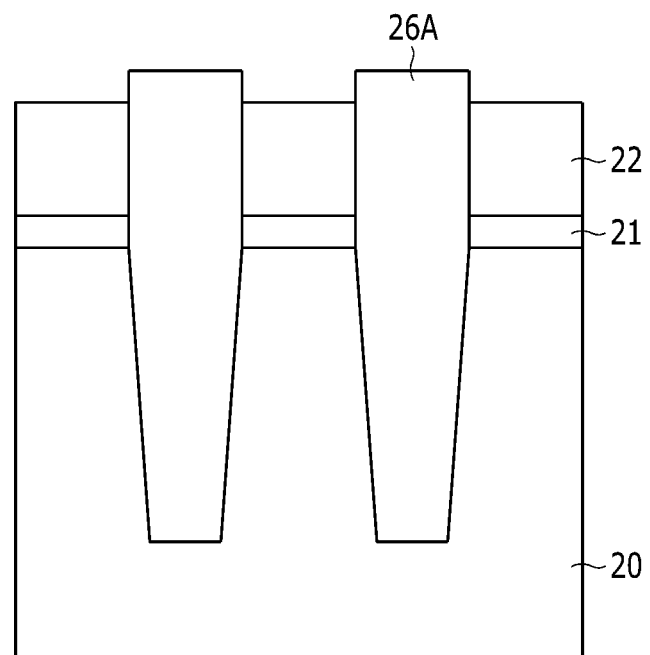

FIG. 3 to FIG. 5 are process cross-sectional views for explaining a device separation process for a flash memory device, the process including an etching process of using the composition for etching according to an embodiment of the present invention.

According to FIG. 3, tunnel oxide film (21), polysilicon film (22), buffer oxide film (23), and pad nitride film (24) are sequentially formed on substrate (20).

Subsequently, pad nitride film (24), buffer oxide film (23), polysilicon film (22), and tunnel oxide film (21) are selectively etched through photolithography and etching processes, and thus, device separation regions of substrate (20) are exposed.

Subsequently, the exposed areas of substrate (20) are selectively etched using pad nitride film (24) as a mask, and trenches (25) having a predetermined depth from the surface are formed.

According to FIG. 4, an oxide film (26) is formed over the entire surface of substrate (20) by using a chemical vapor deposition (CVD) method or the like, until trenches (25) are gap-filled.

Subsequently, a chemical mechanical polishing (CMP) process is performed for oxide film (26) by using pad nitride film (24) as a polishing stop film.

Subsequently, a washing process is performed using dry etching.

According to FIG. 5, pad nitride film (24) is selectively removed by a wet etching process of using the composition for etching according to the present invention, and then buffer oxide film (23) is removed by a washing process. Thereby, device separation film (26A) is formed in the field region.

As illustrated in FIG. 5, according to the present invention, nitride films can be completely and selectively removed for a sufficient time while etching of oxide films gap-filled in an STI pattern is minimized, by using a high-selectivity composition for etching having high etch selectivity for a nitride film with respect to an oxide film. Accordingly, the effective oxide film height (EFH) can be easily controlled, deterioration of electrical characteristics caused by oxide film damage or etching, and particle generation can be prevented, and the device characteristics can be enhanced.

The embodiments described above have been described with regard to flash memory devices; however, the high-selectivity composition for etching according to the present invention is also applicable to device separation processes for DRAM devices.

FIG. 6 to FIG. 11 are process cross-sectional views for explaining a process for forming channels in a flash memory device, the process including an etching process using the composition for etching according to another embodiment of the present invention.

Figure 6:
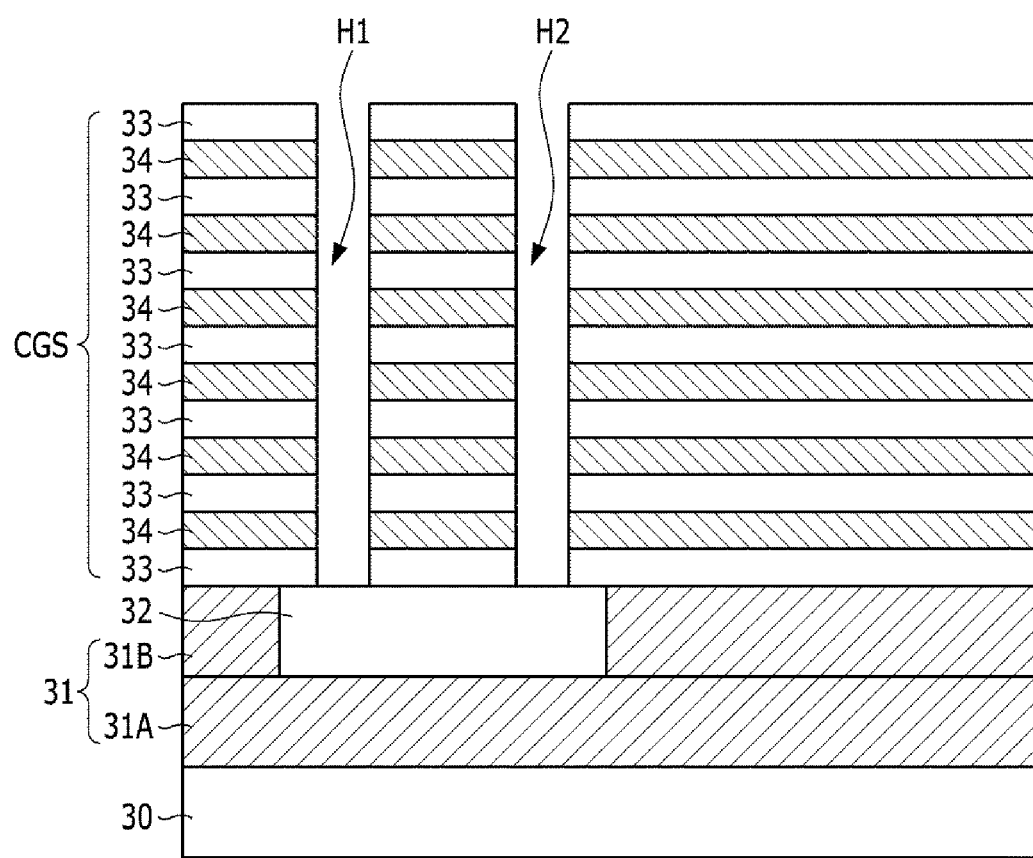
FIG. 6 to FIG. 11 are process cross-sectional views for explaining a pipe channel forming process for a flash memory device, including an etching process of using a composition for etching according to an embodiment of the invention.

According to FIG. 6, pipe gate electrode film (31) having nitride film (32) embedded therein, which is intended for forming pipe channels therein, is formed on substrate (30). First conductive film (31A) and second conducive film (31B) that constitute pipe gate electrode film (31) may contain, for example, polysilicon doped with impurities.

More specifically, first conductive film (31A) is formed on substrate (30), a nitride film is deposited on first conductive film (31A), and this nitride film is patterned to form nitride film (32) for forming pipe channels. Subsequently, second conductive film (31b) is formed on first conductive film (31A) that is exposed by nitride film (32). These first conductive film (31A) and second conductive film (31B) constitute pipe gate electrode film (31).

Subsequently, in order to form a plurality of memory cells that are laminated on the process resultant in a perpendicular direction, first interlayer insulating film (33) and first gate electrode film (34) are alternately laminated. Hereinafter, for the convenience of description, the structure obtained by alternately laminating first interlayer insulating films (33) and first gate electrode films (34) will be referred to as cell gate structure (CGS).

Here, first interlayer insulating films (33) are intended for separation between a plurality of layers of memory cells, and may include, for example, an oxide film. First gate electrode film (34) may include, for example, polysilicon doped with impurities. In the present embodiment, six layers of first gate electrode film (34) are shown in the diagram; however, the invention is not intended to be limited this.

Subsequently, the cell gate structure (CGS) is selectively etched, and thereby a pair of first hole and second hole (H1 and H2) that expose nitride film (32) are formed. First hole and second hole (H1 and H2) are spaces for channel formation in memory cells.

Figure 7:
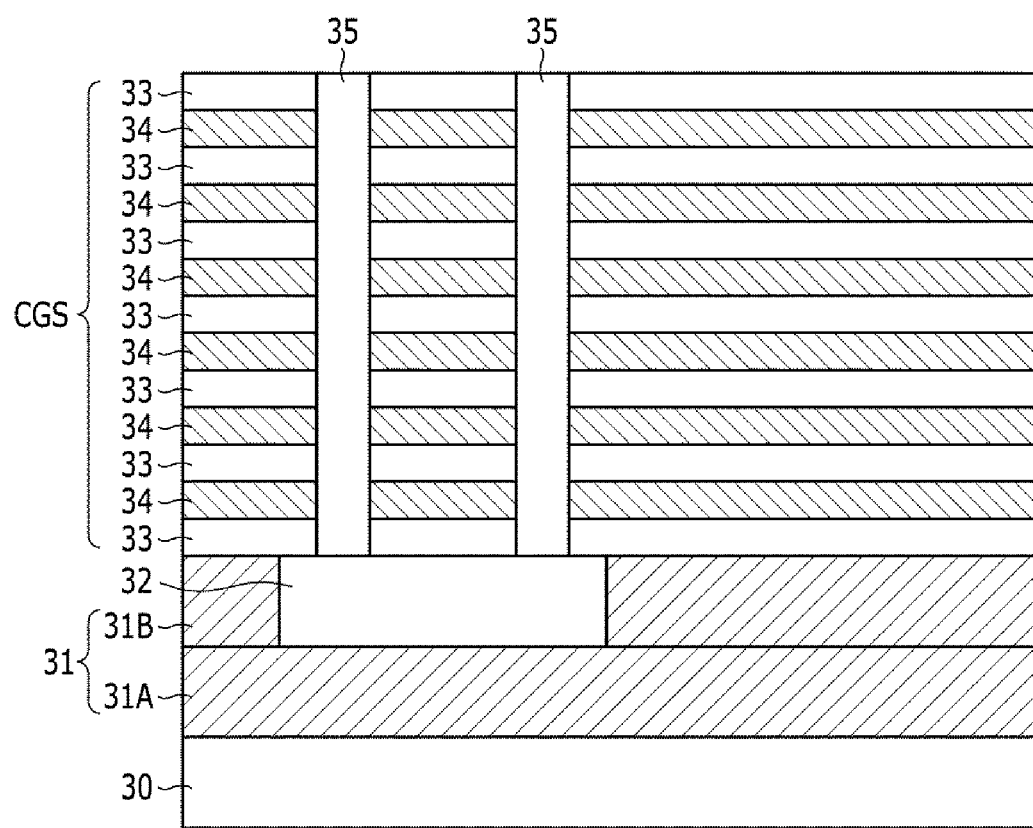

According to FIG. 7, nitride film (35) that is embedded in first hole and second hole (H1 and H2) is formed. This nitride film (35) is intended for preventing any damage that may occur when first gate electrode film (34) is exposed by first hole and second hole (H1 and H2) in the trench forming process (see FIG. 8) that will be described below.

Figure 8:
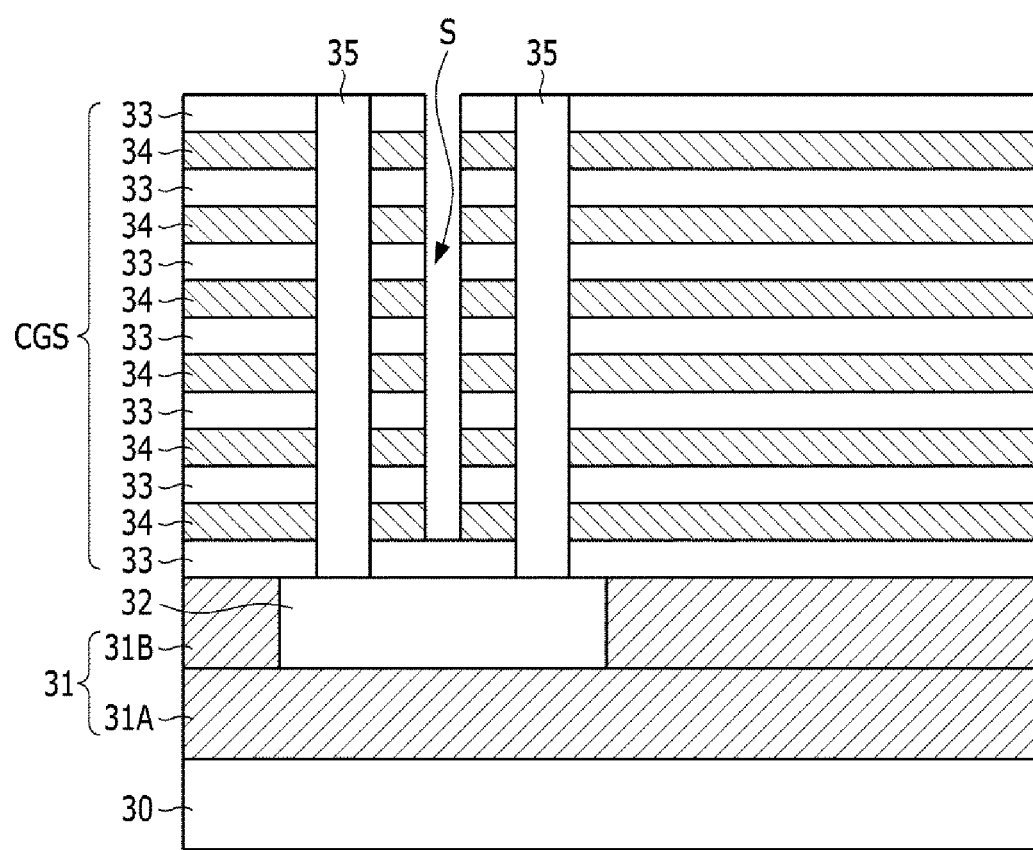

According to FIG. 8, the cell gate structure (CGS) existing between a pair of first hole and second hole (H1 and H2) is selectively etched, and thereby trench (S) is formed, so that a plurality of layers of first gate electrode film (34) are separated into portions corresponding to each of first hole and second hole (H1 and H2).

Figure 9:
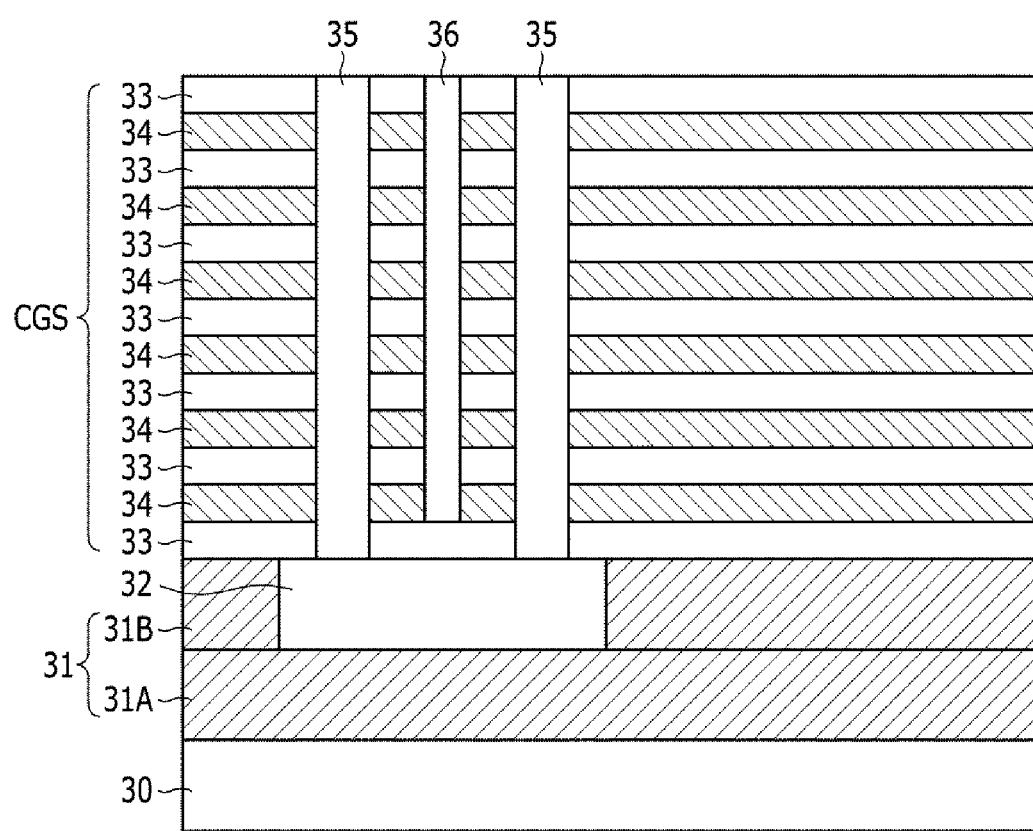

According to FIG. 9, sacrificial film (36) that is embedded in the trench (S) is formed.

Figure 10:
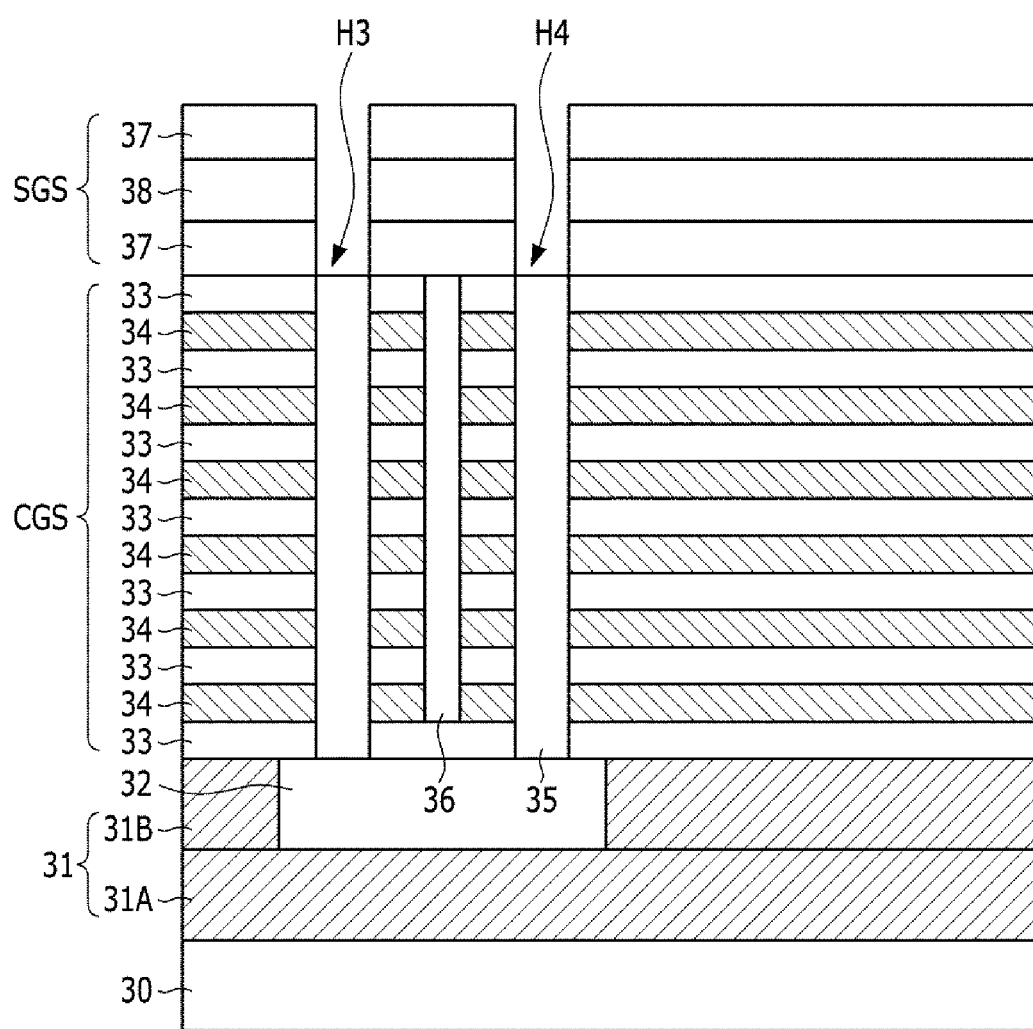

According to FIG. 10, second interlayer insulating film (37), second gate electrode film (38), and second interlayer insulating film (37) are sequentially formed on the process resultant, for the formation of a selection transistor. In the following description, for the convenience of explanation, a laminated structure of second interlayer insulating film (37), second gate electrode film (38), and second interlayer insulating film (37) will be referred to as selective gate structure (SGS).

Second interlayer insulating film (37) may contain, for example, an oxide film, and second gate electrode film (38) may contain, for example, polysilicon doped with impurities.

Subsequently, the selective gate structure (SGS) is selectively etched, and thereby, third hole and fourth hole (H3 and H4) that expose nitride film (35) embedded in a pair of first hole and second hole (H1 and H2) are formed. Third hole and fourth hole (H3 and H4) are regions in which the channels of a selection transistor will be formed.

Figure 11:
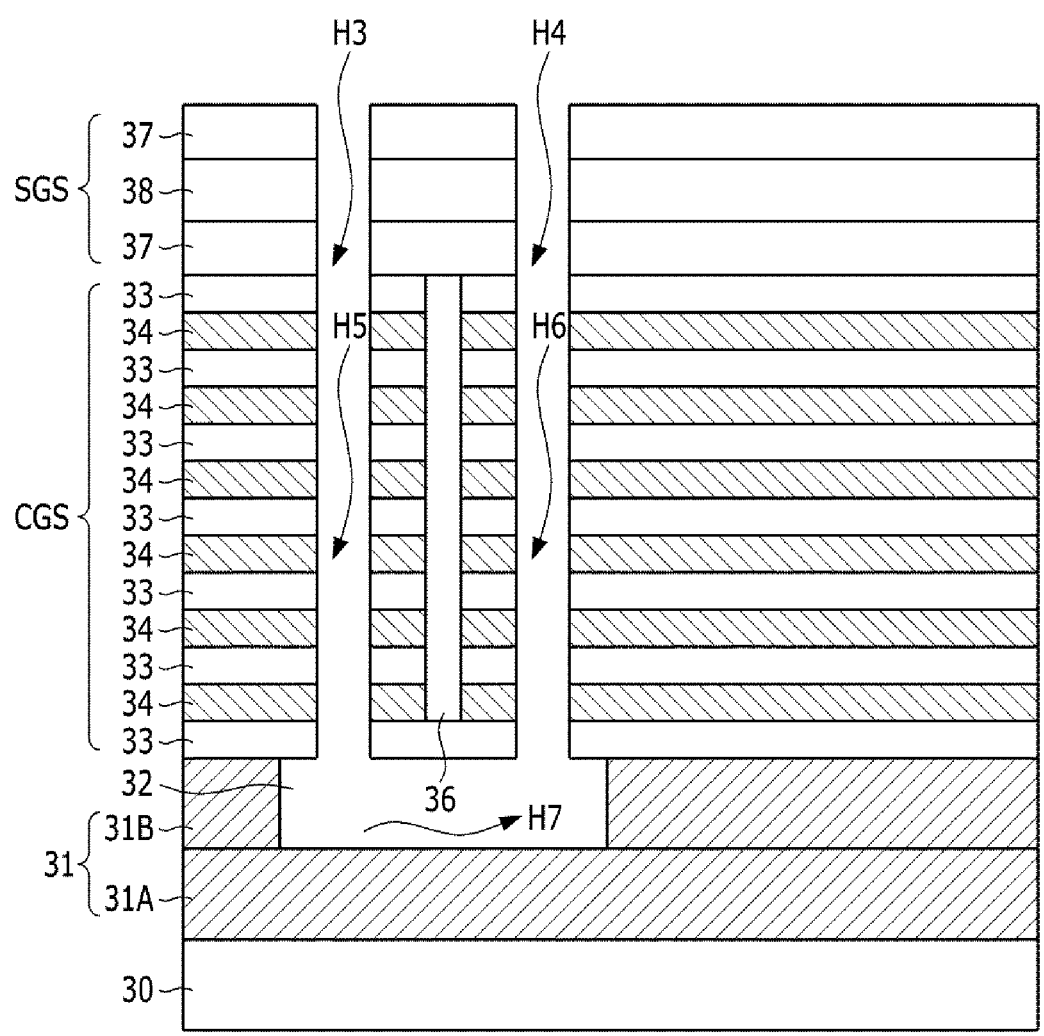

According to FIG. 11, nitride film (35) that is exposed by third hole and fourth hole (H3 and H4), and nitride film (32) disposed therebelow are selectively removed by a wet etching process of using the composition for etching according to the present invention.

As a result of the present process, a pair of cell channel holes (H5 and H6) in which channel films of the memory cell will be formed; and pipe channel hole (H7) that is disposed below the cell channel holes (H5 and H6) and connects these holes with each other, is formed. At this time, by using the high-selectivity composition for etching according to the present invention, nitride films are completely and selectively removed for a sufficient time without loss of oxide films, and pipe channels can be accurately formed without loss of the profile. Furthermore, particle generation, which has conventionally posed a problem, can be prevented, and the safety and reliability of processes can be secured.

Thereafter, subsequent process, for example, a floating gate forming process and a control gate forming process, are carried out, and thus a flash memory device is formed.

Figure 12:
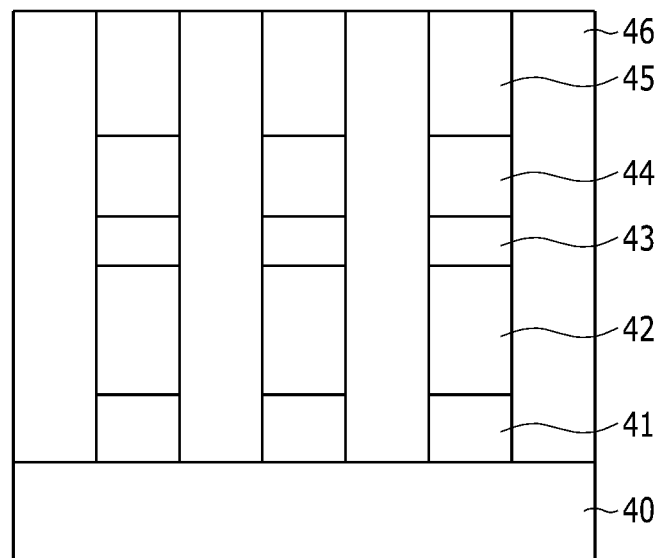
FIG. 12 and FIG. 13 are process cross-sectional views for explaining a diode forming process for a phase change memory, including an etching process of using a composition for etching according to another embodiment of the invention.
Figure 13:
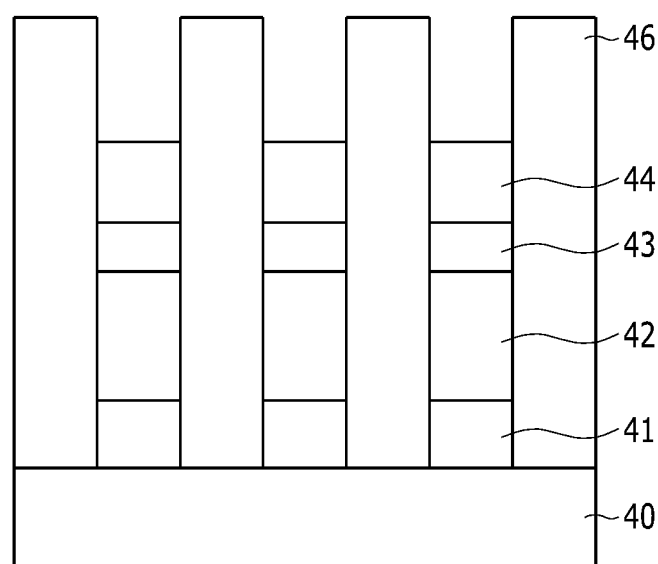

FIG. 12 and FIG. 13 are process cross-sectional views for explaining a process for forming a diode in a phase change memory device, the process including an etching process of using the composition for etching according to another embodiment of the present invention.

According to FIG. 12, an insulating structure having openings, through which conductive region (41) is exposed, is provided on substrate (40). Conductive region (41) may be, for example, an $n^+$ impurity region.

Subsequently, polysilicon film (42) is formed so as to embed portions of the openings, and then ion implantation of impurities is carried out so as to form a diode.

Subsequently, titanium silicide film (43) is formed on top of polysilicon film (42). Titanium silicide film (43) can be formed by forming a titanium film and then heat-treating the titanium film so as to react with polysilicon film (42).

Subsequently, titanium nitride film (44) and nitride film (45) are sequentially formed on top of titanium silicide film (43).

Subsequently, a dry etching process of using a hard mask is carried out, and thereby oxide film (46) is formed in an isolated space between the diodes thus formed. Subsequently, a CMP process is performed, and a primary structure of lower electrodes that are separated from each other is formed.

According to FIG. 13, the process resultant is subjected to a wet etching process of using the composition for etching according to the present invention, and thus nitride film (45) at the top is selectively removed. As such, a nitride film can be completely and selectively removed for a sufficient time without loss of an oxide film, by using the high-selectivity composition for etching according to the present invention at the time of removing the nitride film. Furthermore, deterioration of electrical characteristics caused by any damage to the film quality of an oxide film and etching of an oxide film, and particle generation can be prevented, and the device characteristics can be enhanced.

Subsequently, titanium is deposited in the spaces where nitride film (45) has been removed, and thus lower electrodes are formed.

In addition to the processes described above, a method of manufacturing a semiconductor device, which includes an etching process carried out using the composition for etching of the present invention, can be efficiently applied particularly to a process where selective removal of a nitride film is required, for example, a process where selective etching for a nitride film is required in a case in which nitride films and oxide films are alternately laminated or exist as a mixture.

MODE FOR INVENTION

Hereinafter, Examples of the present invention will be described in detail so that those having ordinary skill in the art to which the present invention is pertained can easily carry out the invention. However, the present invention can be realized in various different forms and is not intended to be limited to the Examples described herein.

Production Example: Production of Silane Inorganic Acid Salt

Silane inorganic acid salts were produced as disclosed in the following Table 1.

TABLE 1

| Production Example | Silane compound | Second inorganic acid | Weight ratio of second inorganic acid and silane compound | Reaction temperature (° C.) |
|---|---|---|---|---|
| A1 | Compound represented by Chemical Formula 10, in which $R^1$ is a methyl group; and $R^2$ to $R^4$ are each a chloro group. | Phosphoric acid | 20:100 | 70 |
| A2 | Compound represented by Chemical Formula 10, in which $R^1$ is a methyl group; and $R^2$ to $R^4$ are each a chloro group. | Sulfuric acid | 10:100 | 70 |
| A3 | Compound represented by Chemical Formula 10, in which $R^1$ is a methyl group; and $R^2$ to $R^4$ are each a chloro group. | Nitric acid | 10:100 | 50 |
| B1 | Compound represented by Chemical Formula 10, in which $R^1$ is a methyl group; and $R^2$ to $R^4$ are each a chloro group. | Pyrophosphoric acid | 10:100 | 70 |
| B2 | Compound represented by Chemical Formula 10, in which $R^1$ is a methyl group; and $R^2$ to $R^4$ are each a chloro group. | Polyphosphoric acid (including three phosphorus atoms) | 20:100 | 70 |
| C1 | Compound represented by Chemical Formula 20, in which $R^6$ to $R^9$ are each a chloro group; $R^5$ and $R^{10}$ are each a methyl group; and n is 1. | Phosphoric acid | 50:100 | 90 |
| C2 | Compound represented by Chemical Formula 20, in which $R^6$ to $R^9$ are each a chloro group; $R^5$ and $R^{10}$ are each a methyl group; and n is 1. | Pyrophosphoric acid | 50:100 | 90 |
| C3 | Compound represented by Chemical Formula 20, in which $R^6$ to $R^9$ are each a chloro group; $R^5$ and $R^{10}$ are each a methyl group; and n is 1. | Sulfuric acid | 40:100 | 120 |
| C4 | Compound represented by Chemical Formula 20, in which $R^6$ to $R^9$ are each a chloro group; $R^5$ and $R^{10}$ are each a methyl group; and n is 1. | Nitric acid | 50:100 | 150 |
| C5 | Compound represented by Chemical Formula 20, in which $R^6$ to $R^9$ are each a chloro group; $R^5$ and $R^{10}$ are each a methyl group; and n is 1. | Polyphosphoric acid (including three phosphorus atoms) | 50:100 | 150 |

Reference Example: Production of Composition for Etching

As shown in the following Table 2, compositions for etching were produced by mixing the compound indicated in the following Table 2 as a second additive, and phosphoric acid as a first inorganic acid, at the weight ratios indicated in the table with respect to the total weight of the composition, without incorporating a first additive. For the first inorganic acid, a 85% aqueous solution was used.

TABLE 2

| | First inorganic acid (wt %) | Second additive (wt %) |
|---|---|---|
| Reference Example 1-1 | Phosphoric acid (balance) | Compound produced in Production Example A1 (1.0) |
| Reference Example 1-2 | Phosphoric acid (balance) | Compound produced in Production Example B1 (0.5) |
| Reference Example 1-3 | Phosphoric acid (balance) | Compound produced in Production Example C1 (1.0) |
| Reference Example 1-4 | Phosphoric acid (balance) | Aminopropylsilanetriol (1.2) |
| Reference Example 1-5 | Phosphoric acid (balance) | (Aminopropyl)tris(diethylaminosiloxy)silane (0.1) |
| Reference Example 1-6 | Phosphoric acid (balance) | (Aminopropyl)tris(diethylaminosiloxy)silane (0.1) + acetone oxime (1.0) |
| Reference Example 1-7 | Phosphoric acid (balance) | Methyl tris(methyl ethyl ketoxime)silane (0.1) |

Experiment Example 1: Measurement of Selectivity of Composition for Etching Thus Produced Etching for a nitride film and an oxide film at a process temperature of 157° C. was performed using the compositions for etching produced in the Reference Examples described above, and the etch rate and selectivity for a nitride film and an oxide film were measured using an ellipsometer (NANOVIEW, SEMG-1000), which is a thin film thickness measuring apparatus. The etch rates and selectivity values are presented in Table 3. The etch rate is a value obtained by etching a film for 300 seconds, and subsequently measuring the film thickness before the etching treatment and the film thickness after the etching treatment, and dividing the difference of the film thicknesses by the etching time (minutes), and the selectivity represents the ratio of the etch rate for a nitride film with respect to the etch rate for an oxide film.

Meanwhile, in Comparative Example 1, the etch rate and the selectivity were measured as described above at a process temperature of 157° C. using phosphoric acid. In Comparative Example 2, the etch rate and the selectivity were measured at a process temperature of 130° C., which is a low process temperature applicable to a process where hydrofluoric acid is added, using a mixture obtained by adding 0.05% of hydrofluoric acid to phosphoric acid. In Comparative Example 3, the etch rate and the selectivity were measured at a process temperature of 157° C., which is the same temperature as that employed in Examples, using the same mixture as that used in Comparative Example 2. The phosphoric acid used in Comparative Examples 1 to 3 was a 85% aqueous solution. The evaluation results for Comparative Examples 1 to 3 are also presented in the following Table 3.

TABLE 3

| | Process temperature (° C.) | Nitride film etch rate (Å/min) | Oxide film etch rate (Å/min) | | Selectivity | |
|---|---|---|---|---|---|---|
| | | | $ThO_x$[1] | LP-TEOS[2] | $ThO_x$[1] | LP-TEOS[2] |
| Comparative Example 1 | 157 | 65.02 | 1.20 | 3.26 | 54.18 | 19.94 |
| Comparative Example 2 | 130 | 18.23 | 0.00 | 0.03 | — | 607.67 |
| Comparative Example 3 | 157 | 78.69 | 6.56 | 8.26 | 12.00 | 9.53 |

TABLE 3-continued

| | Process temperature (° C.) | Nitride film etch rate (Å/min) | Oxide film etch rate (Å/min) | | Selectivity | |
|---|---|---|---|---|---|---|
| | | | ThO$_x$[1] | LP-TEOS[2] | ThO$_x$[1] | LP-TEOS[2] |
| Reference Example 1-1 | 157 | 65.26 | 0.10 | 0.13 | 652.60 | 502.00 |
| Reference Example 1-2 | 157 | 64.29 | 0.05 | 0.07 | 1285.80 | 918.43 |
| Reference Example 1-3 | 157 | 65.01 | 0.08 | 0.11 | 812.63 | 591.00 |
| Reference Example 1-4 | 157 | 64.89 | 0.07 | 0.10 | 927.00 | 648.90 |
| Reference Example 1-5 | 157 | 64.56 | 0.06 | 0.10 | 1076.00 | 645.60 |
| Reference Example 1-6 | 157 | 63.05 | 0.09 | 0.16 | 700.56 | 394.06 |
| Reference Example 1-7 | 157 | 65.36 | 0.10 | 0.13 | 653.60 | 502.77 |

[1]ThO: Thermal oxide film
[2]LP-TEOS: Low pressure tetraethyl orthosilicate film According to Table 3, it can be confirmed that the compositions for etching of Reference Examples have noticeably high etch selectivity for a nitride film with respect to an oxide film, compared to Comparative Examples 1 to 3. Therefore, when the compositions for etching according to Reference Examples are used, the EFH can be easily regulated by regulating the etch rate for an oxide film, and any damage to the film quality of an oxide film can be prevented. Furthermore, particle generation, which has conventionally posed a problem, can be prevented, and the stability and reliability of processes can be secured.

Meanwhile, in order to simulate an actual high-temperature phosphoric acid process, a preliminary operation of arbitrarily dissolving a silicon nitride film in the compositions for etching produced as described above and increasing the silicon concentration in the solution, was carried out. At the time of performing the process, as the silicon nitride film is etched, the silicon concentration in the solution increases, and thereby, the etch rate for a silicon oxide film is further decreased. The preliminary operation was carried out until the silicon concentration in the solution reached 100 ppm, and then etching was performed. The results are presented in the following Table 4.

TABLE 4

| | Process temperature (° C.) | Nitride film etch rate (Å/min) | Oxide film etch rate (Å/min) | | Selectivity | |
|---|---|---|---|---|---|---|
| | | | ThO$_x$ | LP-TEOS | ThO$_x$ | LP-TEOS |
| Reference Example 1-1 | 157 | 65.35 | 0.01 | 0.01 | 6535.00 | 6535.00 |
| Reference Example 1-2 | 157 | 64.10 | −0.04 | 0.02 | −1602.50 | 3205.00 |
| Reference Example 1-3 | 157 | 64.56 | −0.01 | 0.00 | −6456.00 | — |
| Reference Example 1-4 | 157 | 64.52 | 0.00 | 0.03 | — | 2150.67 |
| Reference Example 1-5 | 157 | 64.71 | −0.02 | 0.02 | −3235.50 | 3235.50 |
| Reference Example 1-6 | 157 | 64.23 | −0.01 | 0.01 | −6423.00 | 6423.00 |
| Reference Example 1-7 | 157 | 64.67 | −0.03 | −0.01 | −2155.67 | −6467.00 |

According to Table 3 and Table 4 given above, it can be seen that at the time of simulating an actual high-temperature phosphoric acid process, the selectivity of the Reference Examples is noticeably decreased. This is because when the silicon concentration in the solution increases as in the case of an actual process, a silicon oxide film is not etched, but the thickness of the silicon oxide film rather increases.

Example: Production of Composition for Etching

As shown in the following Table 5, compounds indicated in the following Table 5 as first additives, compounds indicated in the following Table 5 as second additives, and phosphoric acid as a first inorganic acid were mixed at the various weight ratios indicated with respect to the total weight of the composition, and thus compositions for etching were produced. Regarding the first inorganic acid, a 85% aqueous solution was used.

TABLE 5

| | First inorganic acid (wt %) | First additive (wt %) | Second additive (wt %) |
|---|---|---|---|
| Example 1-1 | Phosphoric acid (balance) | Phosphorous acid (1) | Compound produced in Production Example A1 (1.0) |
| Example 1-2 | Phosphoric acid (balance) | Phosphorous acid (3) | Compound produced in Production Example B1 (0.5) |
| Example 1-3 | Phosphoric acid (balance) | Phosphorous acid (7) | Compound produced in Production Example C1 (1.0) |
| Example 1-4 | Phosphoric acid (balance) | Phosphorous acid (3) | Aminopropylsilanetriol (1.2) |
| Example 1-5 | Phosphoric acid (balance) | Phosphorous acid (5) | (Aminopropyl)tris(diethylaminosiloxy)silane (0.1) |
| Example 1-6 | Phosphoric acid (balance) | Phosphorous acid (10) | (Aminopropyl)tris(diethylaminosiloxy)silane (0.1) + acetone oxime (1.0) |
| Example 1-7 | Phosphoric acid (balance) | Phosphorous acid (5) | Methyl tris(methyl ethyl ketoxime)silane (0.1) |
| Example 2-1 | Phosphoric acid (balance) | Dimethyl phosphite (3) | Compound produced in Production Example A1 (1.0) |
| Example 2-2 | Phosphoric acid (balance) | Dimethyl phosphite (5) | Compound produced in Production Example B1 (0.5) |
| Example 2-3 | Phosphoric acid (balance) | Dimethyl phosphite (7) | Compound produced in Production Example C1 (1.0) |
| Example 2-4 | Phosphoric acid (balance) | Dimethyl phosphite (7) | Aminopropylsilanetriol (1.2) |
| Example 2-5 | Phosphoric acid (balance) | Dimethyl phosphite (10) | (Aminopropyl)tris(diethylaminosiloxy)silane (0.1) |
| Example 2-6 | Phosphoric acid (balance) | Dimethyl phosphite (5) | (Aminopropyl)tris(diethylaminosiloxy)silane (0.1) + acetone oxime (1.0) |

TABLE 5-continued

| | First inorganic acid (wt %) | First additive (wt %) | Second additive (wt %) |
|---|---|---|---|
| Example 2-7 | Phosphoric acid (balance) | Dimethyl phosphite (5) | Methyl tris(methyl ethyl ketoxime)silane (0.1) |
| Example 3-1 | Phosphoric acid (balance) | Ammonium hypophosphite (5) | Compound produced in Production Example A1 (1.0) |
| Example 3-2 | Phosphoric acid (balance) | Ammonium hypophosphite (3) | Compound produced in Production Example B1 (0.5) |
| Example 3-3 | Phosphoric acid (balance) | Ammonium hypophosphite (7) | Compound produced in Production Example C1 (1.0) |
| Example 3-4 | Phosphoric acid (balance) | Ammonium hypophosphite (4) | Aminopropylsilanetriol (1.2) |
| Example 3-5 | Phosphoric acid (balance) | Ammonium hypophosphite (5) | (Aminopropyl)tris(diethylaminosiloxy)silane (0.1) |
| Example 3-6 | Phosphoric acid (balance) | Ammonium hypophosphite (3) | (Aminopropyl)tris(diethylaminosiloxy)silane (0.1) + acetone oxime (1.0) |
| Example 3-7 | Phosphoric acid (balance) | Ammonium hypophosphite (5) | Methyl tris(methyl ethyl ketoxime)silane (0.1) |

Experiment Example 2: Measurement of Selectivity of Composition for Etching Produced For the compositions for etching produced in Examples described above, an actual high-temperature phosphoric acid process was simulated as described above, and then etching for a nitride film and an oxide film was performed at a process temperature of 157° C. The etch rates and selectivity for a nitride film and an oxide film were measured using an ellipsometer (NANOVIEW, SEMG-1000), which is a thin film thickness measuring apparatus. The etch rates and selectivity are presented in Table 6.

TABLE 6

| | Process temperature (° C.) | Nitride film etch rate (Å/min) | Oxide film etch rate (Å/min) | | Selectivity | |
|---|---|---|---|---|---|---|
| | | | $ThO_x$ | LP-TEOS | $ThO_x$ | LP-TEOS |
| Example 1-1 | 157 | 65.35 | 0.05 | 0.08 | 1307.00 | 816.88 |
| Example 1-2 | 157 | 64.10 | 0.03 | 0.06 | 2136.67 | 1068.33 |
| Example 1-3 | 157 | 64.56 | 0.06 | 0.06 | 1076.00 | 1076.00 |
| Example 1-4 | 157 | 64.52 | 0.03 | 0.06 | 2150.67 | 1075.33 |
| Example 1-5 | 157 | 64.71 | 0.03 | 0.05 | 2157.00 | 1294.20 |
| Example 1-6 | 157 | 64.23 | 0.05 | 0.12 | 1284.60 | 535.25 |
| Example 1-7 | 157 | 64.67 | 0.06 | 0.08 | 1077.83 | 808.38 |
| Example 2-1 | 157 | 65.35 | 0.06 | 0.10 | 1089.17 | 653.50 |
| Example 2-2 | 157 | 64.10 | 0.03 | 0.03 | 2136.67 | 2136.67 |
| Example 2-3 | 157 | 64.56 | 0.06 | 0.06 | 1076.00 | 1076.00 |
| Example 2-4 | 157 | 64.52 | 0.06 | 0.07 | 1075.33 | 921.71 |
| Example 2-5 | 157 | 64.71 | 0.04 | 0.07 | 1617.75 | 924.43 |
| Example 2-6 | 157 | 64.23 | 0.05 | 0.10 | 1284.60 | 642.30 |
| Example 2-7 | 157 | 64.67 | 0.07 | 0.08 | 923.86 | 808.38 |
| Example 3-1 | 157 | 65.35 | 0.05 | 0.08 | 1307.00 | 816.88 |
| Example 3-2 | 157 | 64.10 | 0.03 | 0.02 | 2136.67 | 3205.00 |
| Example 3-3 | 157 | 64.56 | 0.07 | 0.07 | 922.29 | 922.29 |
| Example 3-4 | 157 | 64.52 | 0.05 | 0.06 | 1290.40 | 1075.33 |
| Example 3-5 | 157 | 64.71 | 0.03 | 0.06 | 2157.00 | 1078.50 |
| Example 3-6 | 157 | 64.23 | 0.06 | 0.11 | 1070.50 | 583.91 |
| Example 3-7 | 157 | 64.67 | 0.06 | 0.09 | 1077.83 | 718.56 |

According to Table 6, it can be confirmed that the compositions for etching of Examples show significantly high etch selectivity for a nitride film with respect to an oxide film even at the time of simulating an actual high-temperature phosphoric acid process, by further containing the first additive.

The present invention is not intended to be limited by the embodiments described above and the attached drawings, and it will be obvious to those having ordinary skill in the art to which the present invention is pertained, that various replacements, alterations, and modifications can be made to the extent that the technical idea of the present invention is maintained.

[List of Reference Numerals]

| | |
|---|---|
| 20, 30, 40: Substrate | 21: Tunnel oxide film |
| 22: Polysilicon film | 23: Buffer oxide film |
| 24: Pad nitride film | 25: Trench |
| 26: Oxide film | 26A: Device separation film |
| 31: Pipe gate electrode film | 32, 35: Nitride film |
| 36: Sacrificial film | 33: First interlayer insulating film |
| 34: First gate electrode film | 37: Second interlayer insulating film |
| 38: Second gate electrode film | 41: Conduction region |
| 42: Polysilicon film | 43: Titanium silicide film |
| 44: Titanium nitride film | 45: Nitride film |
| 46: Oxide film | |

INDUSTRIAL APPLICABILITY

The present invention relates to a composition for etching and a method of manufacturing a semiconductor device, the method including an etching process using the composition for etching. The composition for etching is a high-selectivity composition for etching that can selectively remove a nitride film while minimizing the etch rate for an oxide film and does not have problems such as particle generation, which adversely affect the device characteristics.

The invention claimed is:

1. A method for forming a cell gate structure, the method comprising:
   forming a cell gate structure on a substrate by alternatively stacking a plurality of interlayer insulating layers and a plurality of gate electrode layers;
   forming a plurality of holes through the cell gate structure; and
   selectively etching a plurality of nitride layers in the cell gate structure by a composition,
   wherein the composition for the selective etching comprises:
   a first inorganic acid,
   a first additive, being any one selected from the group consisting of phosphorous acid, an organic phosphite, a hypophosphite, and mixtures thereof,
   a second additive comprising a silane inorganic acid salt produced by reaction between a second inorganic acid and a silane compound; and
   a solvent,
   wherein:
   the second inorganic acid is at least one selected from the group consisting of a phosphoric acid, an anhydrous phosphoric acid, a pyrophosphoric acid, a polyphosphoric acid, and a combination thereof; and the silane compound is a compound selected from Chemical Formulas A10, A20, and their combination, the silane inorganic acid salt is represented by Chemical Formula C200-1, wherein the composition for etching comprises the first additive at a proportion of 0.01% to 15% by weight, the first inorganic acid at a proportion of 70% to 99% by weight, the second additive at a proportion of 0.01% to 20% by weight, and the solvent as the balance,

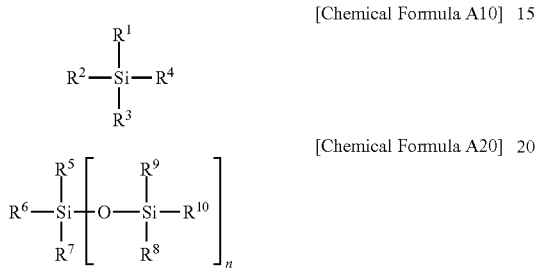

[Chemical Formula A10]

[Chemical Formula A20]

(In Chemical Formula A10 and Chemical Formula A20, each $R^1$ to $R^{10}$ is independently selected from the group consisting of hydrogen, halogen, ($C_1$-$C_{10}$) alkyl, ($C_1$-$C_{10}$) alkoxy, and ($C_6$-$C_{30}$) aryl, at least one of $R^1$ to $R^4$ is hydrogen, or ($C_1$-$C_{10}$) alkoxy, and n is one of integer numbers from 1 to 10,)

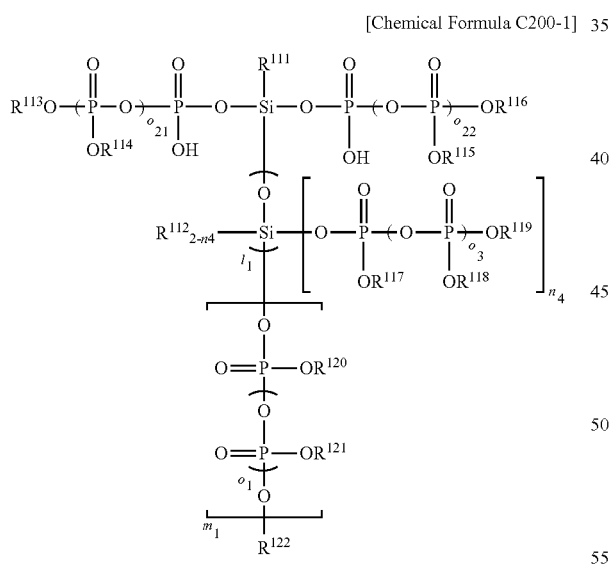

[Chemical Formula C200-1]

(In Chemical Formula C200-1, each $R^{111}$ to $R^{112}$ is independently selected from the group consisting of hydrogen, halogen, ($C_1$-$C_{10}$) alkyl, ($C_1$-$C_{10}$) alkoxy, and ($C_6$-$C_{30}$) aryl, each $R^{113}$ to $R^{122}$ is independently hydrogen, each $o_1$, $o_{21}$, $o_{22}$ and $o_3$ is independently one of integer numbers from 0 to 10, $n_4$ is one of integer numbers from 0 to 2, li is one of integer numbers from 0 to 10, $m_1$ is 0 or 1).

2. The method of claim 1, wherein any one of hydrogen of $R^{113}$ to $R^{122}$ in the Chemical Formula C200-1 is substituted by Chemical Formula C220-1,

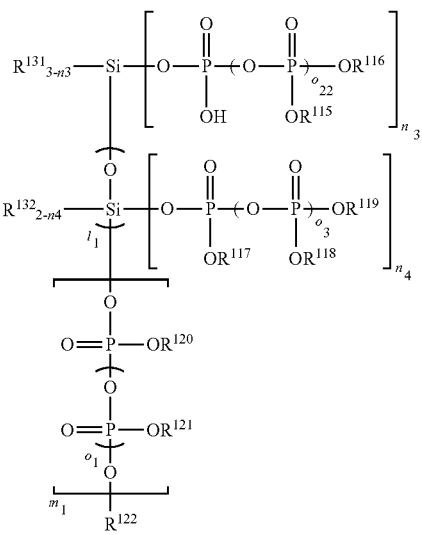

[Chemical Formula C220-1]

(In Chemical Formula C220-1, any one of $R^{131}$ to $R^{132}$ is a coupler coupling to Chemical Formula C200-1, the other is independently selected from the group consisting of hydrogen, halogen, ($C_1$-$C_{10}$) alkyl, ($C_1$-$C_{10}$) alkoxy, and ($C_6$-$C_{30}$) aryl, and each $R^{113}$ to $R^{122}$ is independently hydrogen, or substituted by a substituent represented by Chemical Formula C220-1, and each $o_1$, $o_{21}$, $o_{22}$ and $o_3$ is independently one of integer numbers from 0 to 10, $n_4$ is one of integer numbers from 0 to 2, $1_1$ is one of integer numbers from 0 to 10, $m_1$ is 0 or 1).

3. The method of claim 1, wherein the silane inorganic acid salt represented by Chemical Formula C200-1 is any one selected from the group consisting of Chemical Formulas 52, 53, 55, 56, 57, 103, 106, 107, 108, 205, 207, 208, 209, 210, and their combination,

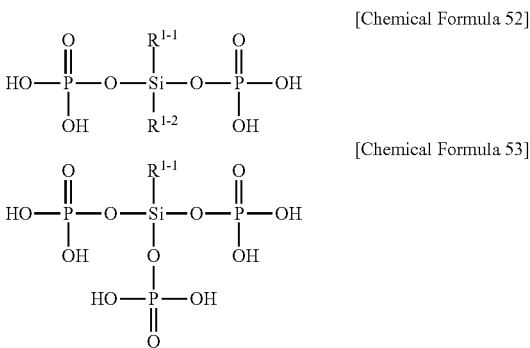

[Chemical Formula 52]

[Chemical Formula 53]

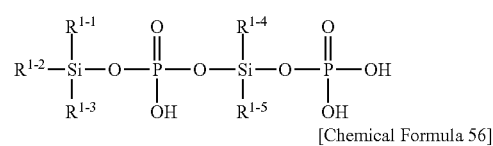

[Chemical Formula 55]

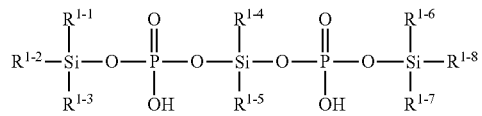

[Chemical Formula 56]

[Chemical Formula 57]

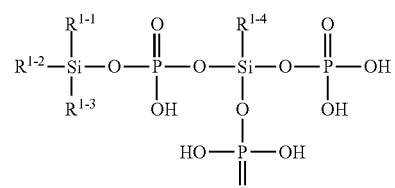

[Chemical Formula 103]

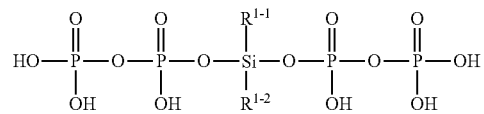

[Chemical Formula 106]

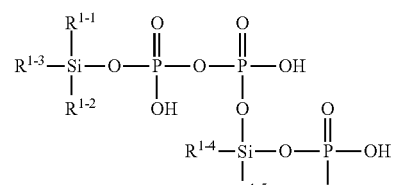

[Chemical Formula 107]

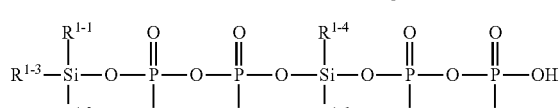

[Chemical Formula 108]

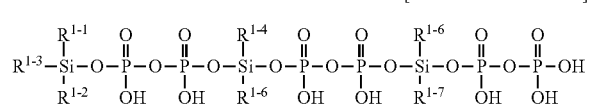

[Chemical Formula 205]

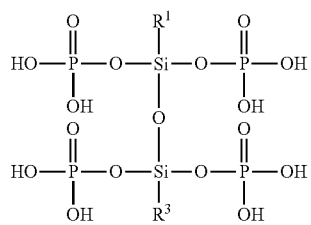

[Chemical Formula 207]

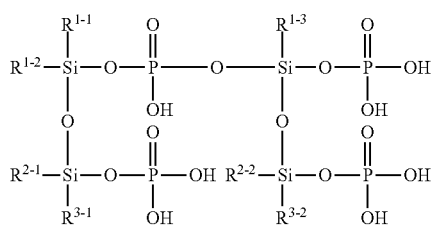

[Chemical Formula 208]

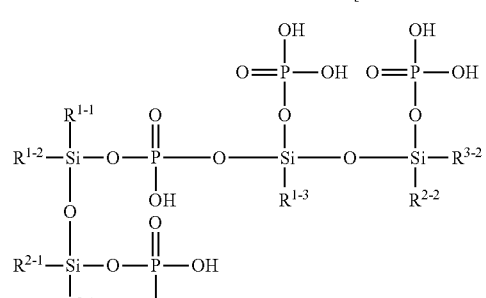

[Chemical Formula 209]

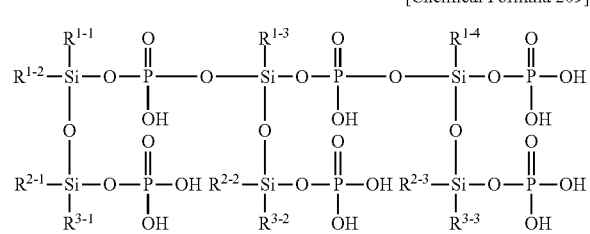

[Chemical Formula 210]

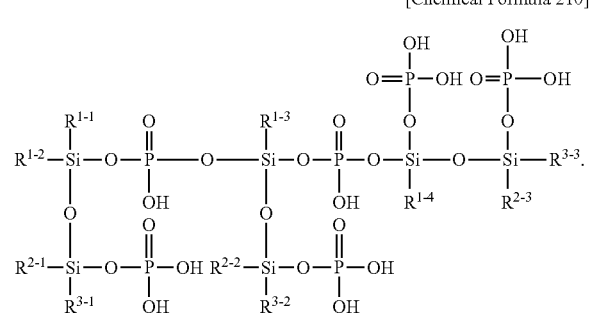

(In Chemical Formulas 52, 53, 55, 56, 57, 103, 106, 107, 108, 205, 207, 208, 209 and 210, each $R^1$, $R^2$, $R^{1-1}$, $R^{1-2}$, $R^{1-3}$, $R^{1-4}$, $R^{1-5}$, $R^{1-6}$, $R^{1-7}$, $R^{1-8}$, $R^{2-1}$, $R^{2-2}$, $R^{3-1}$, $R^{3-2}$, and $R^{3-3}$ is independently selected from the group consisting of hydrogen, halogen, ($C_1$-$C_{10}$) alkyl, ($C_1$-$C_{10}$) alkoxy, and ($C_6$-$C_{30}$) aryl).

* * * * *